US012677706B2

(12) United States Patent
Bang

(10) Patent No.: US 12,677,706 B2
(45) Date of Patent: Jul. 7, 2026

(54) DISPLAY DEVICE HAVING LIGHT EMITTING STRUCTURE

(71) Applicant: LG ELECTRONICS INC., Seoul (KR)

(72) Inventor: Hyungseok Bang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 481 days.

(21) Appl. No.: 18/196,937

(22) Filed: May 12, 2023

(65) Prior Publication Data

US 2024/0203951 A1 Jun. 20, 2024

(30) Foreign Application Priority Data

Dec. 15, 2022 (KR) ........................ 10-2022-0175945

(51) Int. Cl.
*H10W 90/00* (2026.01)
*H10H 20/814* (2025.01)
*H10H 20/825* (2025.01)
*H10H 20/831* (2025.01)
*H10H 20/857* (2025.01)

(52) U.S. Cl.
CPC .......... *H10W 90/00* (2026.01); *H10H 20/814* (2025.01); *H10H 20/825* (2025.01); *H10H 20/8312* (2025.01); *H10H 20/857* (2025.01)

(58) Field of Classification Search
CPC ... H10W 90/00; H10H 20/814; H10H 20/825; H10H 20/8312; H10H 20/857; H10H 20/831; H10H 20/853; H10H 29/142; H10H 20/856; H10D 86/441; H10D 86/451
See application file for complete search history.

(56) References Cited

U.S. PATENT DOCUMENTS

2008/0308921 A1* 12/2008 Kim .................... H01L 23/3135
257/E21.705
2019/0198485 A1 6/2019 Chae et al.
2021/0384181 A1 12/2021 Xu et al.
2021/0384182 A1* 12/2021 Xu ........................ H10H 20/855

FOREIGN PATENT DOCUMENTS

EP 4 012 765 A1 6/2022
EP 4 020 552 A1 6/2022
KR 10-2019-0024615 A 3/2019
KR 10-2022-0024710 A 3/2022
WO WO 2020/257680 A1 12/2020

* cited by examiner

*Primary Examiner* — Su C Kim

(74) *Attorney, Agent, or Firm* — Birch, Stewart, Kolasch & Birch, LLP

(57) ABSTRACT

Discussed is a display device having a light emitting structure that can include first light emitting structures stacked on a first insulating layer on top of a driving panel, second light emitting structures stacked in alignment with the first light emitting structures on a second insulating layer on top of the first light emitting structures, and light emitting elements stacked on a third insulating layer on top of the second light emitting structures to be spaced apart from centers of the second light emitting structures. Each of the light emitting elements includes a p-electrode and an n-common electrode, and the p-electrode of the light emitting element can be connected to one of p-electrodes of the driving panel through an insulating structure, in which the first to third insulating layers are vertically connected.

20 Claims, 28 Drawing Sheets

CMOS DRIVING PANEL ——1400

1100a-1

(a)

1100c-1

1100b-1

1100a-1

CMOS DRIVING PANEL ——1400

(b)

WIRING
STRUCTURE (1200)

(a)

(b)

(a)

(b)

(c)

(a)

(b)

(a)

(b)

(a)

(b)

(a)

(b)

(a)

EMITTING REGION (b)

(a)

(b)

(a)

(b)

(a)

(b)

(a)

(b)

(a)

(b)

DISPLAY DEVICE HAVING LIGHT EMITTING STRUCTURE

CROSS-REFERENCE TO RELATED APPLICATION

Pursuant to 35 U.S.C. § 119(a), this application claims priority to Korean Patent Application No. 10-2022-0175945, filed on Dec. 15, 2022 in the Republic of Korea, the entire contents of which are hereby expressly incorporated by reference into the present application.

BACKGROUND

Field

The present disclosure relates to a display device having a light emitting structure. One more particular embodiment relates to a display device having a stacked light emitting structure, and a method for manufacturing the same.

Discussion of the Related Art

In recent years, display devices having excellent characteristics such as a thin shape, flexibility, and the like, are being developed in a field of a display technology. On the contrary, currently commercialized main displays are represented by liquid crystal displays (LCDs) and active matrix organic light emitting diodes (AMOLEDs). However, there exist problems such as not-so-fast response time and difficult implementation of flexibility in the case of LCDs, and there exist drawbacks such as short life span and not-so-good yield in the case of AMOLEDs.

On the other hand, light emitting diodes (LEDs) are well known light emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting elements can be used to implement a display, thereby presenting a scheme for addressing the problems of the LCD's and the AMOLEDs.

When implementing such an LED light emitting structure at a smaller scale, there is a risk of short circuit between p-n regions due to metal electrodes disposed inside the LED. Specifically, when an insulating layer is formed on an inner wall of a via hole in an ultra-fine structure of the smaller scale LED light emitting structure, it is difficult to implement an electrical connection between an upper electrode and a lower electrode of the LED.

In addition, damage can occur on an etched surface inside the LED for forming the electrodes. Accordingly, a dangling bond can occur and thereby a decrease in light efficiency can be caused. In particular, a significant decrease in light efficiency can occur during fabrication of an ultra-fine structure. Therefore, when an LED light emitting structure is implemented in a wearable device in a structure in which a space for implementing the light emitting structure is limited, the light efficiency can be significantly decreased.

The decrease in light efficiency can also occur due to an interaction between a metal for an electrode disposed inside the LED and excitons. On the other hand, it may not be easy to align polarization of red light, green light, and blue light when forming a resonance mode and a stacked structure inside each light emitting body.

Meanwhile, an LEDoS (LED on Silicon) pixel-based light emitting structure can be applied to Virtual Reality (VR) and/or Augmented Reality (AR) devices. There is a problem that the pixel-based light emitting structure must be implemented within limited spaces of VR and/or AR devices. In this regard, red, green, and blue-light emitting elements can be implemented in a stacked structure.

On the other hand, the red-light emitting element has a problem in that light efficiency is lower than those of other light emitting elements. In addition, if a red AlGaInP LED is formed first and then a green or blue GaN LED is formed, a GaN equipment contamination issue and an equipment operation efficiency degradation issue can occur.

SUMMARY OF THE DISCLOSURE

One aspect of the present disclosure is to provide a display device having a light emitting structure and a method for manufacturing the same.

Another aspect of the present disclosure is to solve a problem that light efficiency of a red-light emitting element is lower than those of other light emitting elements.

Still another aspect of the present disclosure is to solve a GaN equipment contamination issue when a red AlGaInP LED is formed first and then a green or blue GaN LED is formed.

Still another aspect of the present disclosure is to solve an equipment operation efficiency degradation issue when a red AlGaInP LED is formed first and then a green or blue GaN LED is formed.

Still another aspect of the present disclosure is to easily arrange various electrodes and connection wires as needed in a light emitting structure.

Still another aspect of the present disclosure is to solve a short-circuit risk issue between p-n regions when forming an ultra-fine electrode structure.

Still another aspect of the present disclosure is to improve light efficiency by eliminating an influence of excitons due to a metal or absorption of internally formed photon energy into the metal.

Still another aspect of the present disclosure is to contribute to an efficiency improvement by removing damage due to internal etching that can occur when forming wires inside an LED.

Still another aspect of the present disclosure is to facilitate the formation of an optical resonance mode.

Still another aspect of the present disclosure is to control and align polarization of light emitted from red, green, and blue-light emitting bodies when forming a stacked light emitting structure.

To achieve those aspects and other advantages of the present disclosure, there is provided a display device having a light emitting structure that can include first light emitting structures stacked on a first insulating layer on top of a driving panel, second light emitting structures stacked in alignment with the first light emitting structures on a second insulating layer on top of the first light emitting structures, and light emitting elements stacked on a third insulating layer on top of the second light emitting structures to be spaced apart from centers of the second light emitting structures. Each of the light emitting elements can include a p-electrode and an n-common electrode, and the p-electrode of the light emitting element can be connected to one of p-electrodes of the driving panel through an insulating structure in which the first to third insulating layers are vertically connected.

According to an embodiment, the first light emitting structures, the second light emitting structures, and the light emitting elements can constitute a first layer, a second layer, and a third layer, respectively. The light emitting element can be implemented as a flip-chip having a first diameter. The flip-chip disposed on the third layer can be disposed between first and second light emitting elements that are two of the second light emitting structures disposed in one axial direction. The p-electrode connected to a lower region of the flip chip is connected to the one of the p-electrodes of the driving panel through the insulating structure spaced from the insulating layer surrounding the first light emitting element. The n-common electrode connected to the lower region of the flip chip can be connected to the n-common electrode of the driving panel through a second insulating structure spaced from the insulating layer surrounding the second light emitting element.

According to an embodiment, the flip-chip can be disposed between third and fourth light emitting elements that are two of the second light emitting structures disposed in another axial direction perpendicular to the one axial direction. One end of the flip-chip in the another axial direction can be disposed above the p-electrode of the third light emitting element. Another end of the flip-chip in the another axial direction can be spaced apart from an insulating layer surrounding the fourth light emitting element. The n-common electrode can be connected to the n-electrode of the first light emitting structure and the n-electrode of the second light emitting structure.

According to an embodiment, the light emitting element can be implemented as a chip having a first diameter. The chip disposed on the third layer can be disposed between first and second light emitting elements that are two of the second light emitting structures disposed in one axial direction. The p-electrode connected to a lower region of the chip is connected to one of the p-electrodes of the driving panel through the insulating structure spaced from the insulating layer surrounding the first light emitting element.

According to an embodiment, the n-common electrode connected to an upper region of the chip can be stacked on opposite side regions of the chip and an upper region of the third insulating layer formed in a region between the chips.

According to an embodiment, the n-electrode of the first light emitting structure and the n-electrode of the second light emitting structure can be connected to a wiring structure penetrating a second insulating structure spaced from an insulating layer surrounding the second light emitting element to form the n-common electrode. The n-common electrode of the first light emitting structure and the second light emitting structure can be formed in a structure separated from the n-common electrode connected to the upper region of the chip.

According to an embodiment, the light emitting element can be implemented as a second chip having a second diameter shorter than the first diameter. The second chip disposed on the third layer can be disposed between first and second light emitting elements that are two of the second light emitting structures disposed in the one axial direction. The p-electrode connected to a metal layer extending from a lower part of the second chip can be connected to one of the p-electrodes of the driving panel through the insulating structure that is spaced apart from the insulating layer surrounding the first light emitting element.

According to an embodiment, the n-common electrode connected to an upper region of the second chip can be stacked on one side region of the second chip and an upper region of the third insulating layer formed in a region between the chips.

According to an embodiment, the n-electrode of the first light emitting structure and the n-electrode of the second light emitting structure can be connected to a wiring structure penetrating a second insulating structure spaced from the insulating layer surrounding the second light emitting element to form the n-common electrode. The n-common electrodes of the first light emitting structure and the second light emitting structure can be formed in a structure separated from the n-common electrode of the upper region of the second chip.

According to an embodiment, the n-common electrode connected to an upper region of the second chip is stacked on the upper region of the second chip and an upper region of a fourth insulating layer disposed on the third insulating layer. The n-electrode of the first light emitting structure and the n-electrode of the second light emitting structure are connected to a wiring structure penetrating a second insulating structure spaced from the insulating layer surrounding the second light emitting element to form the n-common electrode. The n-common electrode of the first light emitting structure and the second light emitting structure is formed in a structure separated from the n-common electrode formed in the upper region of the second chip.

According to an embodiment, the driving panel can include an n-common electrode, a p-red electrode, a p-green electrode, and a p-blue electrode. Insulating layers formed to surround front and side surfaces of the first light emitting structure and the second light emitting structure can form a via structure to connect electrodes of the first layer to the third layer and the electrodes of the driving panel.

According to an embodiment, the display device can further include a wiring structure formed on front and side surfaces of the insulating layers on the front and side surfaces to connect the first light emitting structure and the second light emitting structure to the electrodes of the driving panel. The wiring structure of the first layer includes first and second wiring structures disposed in one axial direction and a third wiring structure disposed in another axial direction of the first light emitting structure.

According to an embodiment, boundary regions of the insulating layer disposed on the front surface can include extension regions extending from a circular shape to a rectangular shape, and the insulating layer forms a via structure of an inclined side to have a narrower diameter in a downward direction. Electrodes of the first layer to the third layer can be connected to the electrodes of the driving panel through the extension regions of the insulating layer.

According to an embodiment, the display device can include wiring structures disposed on side surfaces of the first light emitting structure and the second light emitting structure. The display device can include a light reflection layer disposed on a bottom of the first light emitting structure. The display device can include a wavelength selective reflection layer disposed between the first light emitting structure and the second light emitting structure and/or on top of the second light emitting structure. A third light emitting structure can be disposed on the wiring structure. The third light emitting structure can be configured as the light emitting element spaced apart from the first light emitting structure and the second light emitting structure.

According to an embodiment, the display device can include a light reflection structure formed of a metal material on a side region of the third light emitting structure. The light reflection structure can extend down to a lower region of the third light emitting structure or a second light reflection layer is disposed between the third light emitting structure and the wiring structure.

According to an embodiment, the display device can include a second light reflection structure formed of a metal material on side regions of the first light emitting structure and the second light emitting structure. The second light reflection layer can be disposed between the third light emitting structure and the wiring structure.

According to an embodiment, the display device can further include a light scattering structure disposed on top of the second light emitting structure and/or on top of the third light emitting structure.

According to an embodiment, the first light emitting structures can be configured as green-light emitting elements. Each wiring structure of the first light emitting structures can include an n-common electrode spaced apart from the first insulating layer, and a first p-electrode, a second p-electrode, and a third p-electrode of red, blue, and green. The n-common electrode can be connected at a top of the first light emitting structure. The third p-electrode can be connected at a bottom of the first light emitting structure.

According to an embodiment, the second light emitting structures can be configured as blue-light emitting elements. Each wiring structure of the second light emitting structures can include an n-common electrode spaced apart from the second insulating layer, and a first p-electrode and a second p-electrode of red and blue. The n-common electrode can be connected at a top of the second light emitting structure. The second p-electrode is connected at the bottom of the first light emitting structure.

According to an embodiment, the light emitting elements can be configured as red-light emitting elements. Each wiring structure of the red-light emitting elements can include a p-electrode and an n-common electrode formed on bottom of the red-light emitting elements.

According to an embodiment, the n-common electrode of the red-light emitting elements can be connected to the n-common electrode of the first light emitting structures and the second light emitting structures. The p-electrode of the red-light emitting elements can be connected to the first p-electrode of the first light emitting structures and the first p-electrode of the second light emitting structures.

Technical effects of a display device having a light emitting structure and a manufacturing method thereof according to the present disclosure can be summarized as follows.

According to the present disclosure, a red-light emitting element can be disposed on top of a stacked structure, to improve light utilization efficiency of the red-light emitting element.

According to the present disclosure, the red-light emitting element can be disposed on the top and implemented as a separate chip. Therefore, when the red-light emitting element made of a material which is different from a material of other light emitting elements is used, a facility contamination issue can be solved.

According to the present disclosure, the red-light emitting element can be disposed on the top and implemented as a separate chip. Therefore, when the red-light emitting element made of a material which is different from a material of other light emitting elements is used, an equipment operation efficiency degradation issue can be solved.

According to the present disclosure, a wiring structure disposed on an outer region of a light emitting structure can be used to facilitate arrangement of various electrodes and a connection wire as needed.

According to the present disclosure, since a metal electrode is not disposed in a light emitting body, a short-circuit issue between p-n regions when forming an ultra-fine electrode structure can be solved.

According to the present disclosure, as a metal is removed from the inside of the light emitting body, light efficiency can be improved by eliminating an influence of excitons due to a metal or absorption of internally formed photon energy into the metal.

According to the present disclosure, in the case of using a light emitting body such as an LED, damage due to internal etching that involves wiring formation inside the LED can be removed, which can contribute to efficiency improvement.

According to the present disclosure, when forming a stacked light emitting structure, polarization of light emitted from green, blue, and red-light emitting bodies can be controlled, which can be advantageous in alignment.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Description will now be given in detail according to example embodiments disclosed herein, with reference to the accompanying drawings. For the sake of brief description with reference to the drawings, the same or equivalent components can be provided with the same or similar reference numbers, and description thereof will not be repeated. In general, a suffix such as "module" and "unit" can be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements can also be present.

A display device disclosed herein can include a portable phone, a smart phone, a laptop computer, a digital broadcast terminal, a personal digital assistant (PDA), a portable multimedia player (PMP), a navigator, a slate PC, a tablet PC, an ultrabook, a digital TV, a desktop computer, a wearable device for displaying AR/VR/XR images, and the like. In addition, the display device described herein can be applied to such various products, and can be used as a component of a light source device such as LCD, LED, and OLED, but need not be limited to the products. For example, it will be readily apparent to those skilled in the art that the configuration according to the embodiments described herein can also be applied to a new product type that will be developed later if the device is a device capable of emitting light.

Figure 1:
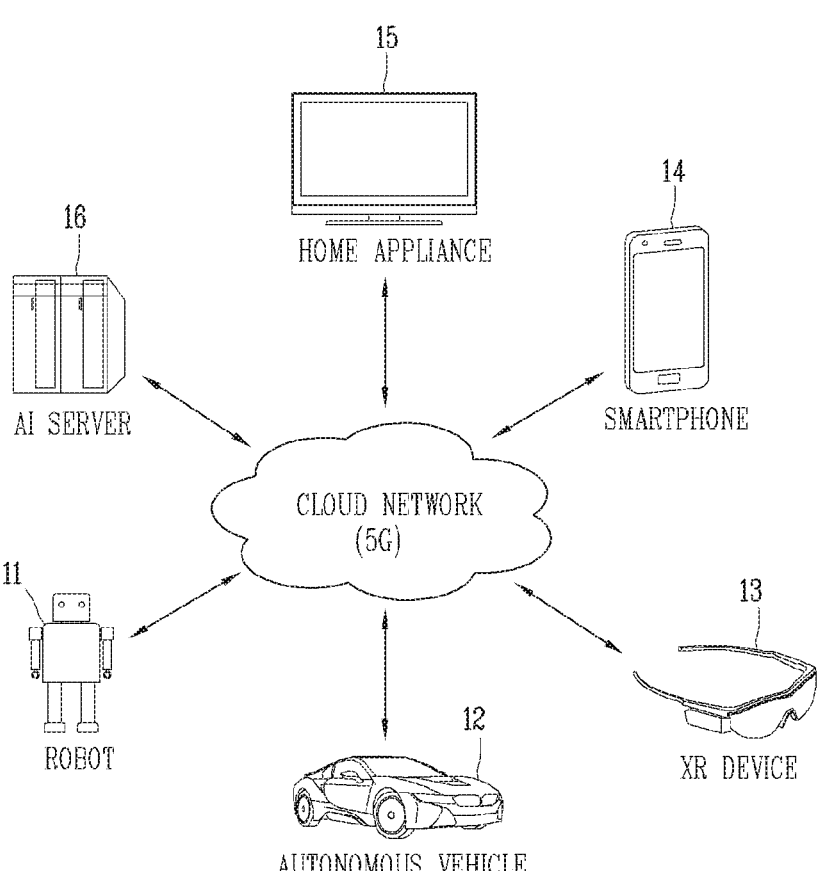
FIG. 1 is a conceptual view illustrating one embodiment of a system to which an electronic device implemented as a display device according to the present disclosure is applicable.

FIG. 1 is a conceptual view illustrating one embodiment of a system to which an electronic device implemented as a display device according to the present disclosure is applicable. Referring to FIG. 1, in the system, at least one of a server 16, a robot 11, an autonomous vehicle 12, an XR device 13, a smartphone 14, or a home appliance 15 can be connected to a cloud network 17. Here, an AI technology can be applied to a system interoperating with an electronic device having a display to implement virtual reality or augmented reality. In this regard, electronic devices, namely, the robot 11, the autonomous vehicle 12, the XR device 13, the smartphone 14, the home appliance 15 and the like, to which the AI technology is applied, can be referred to as AI devices 11 to 15.

The cloud network 17 can refer to a network that constitutes a part of a cloud computing infrastructure or exists in the cloud computing infrastructure. Here, the cloud network 17 can be configured by using a 3G network, a 4G or Long Term Evolution (LTE) network, or a 5G network. For example, the devices 11 to 16 constituting the AI system can be connected to each other through the cloud network 17. In particular, the devices 11 to 16 can communicate with each other through a base station, but can also directly communicate with each other without the base station. The AI server 16 can include a server that performs AI processing and a server that performs big data computation.

The AI server 16 can be connected to at least one of the AI devices constituting the AI system, namely, the robot 11, the autonomous vehicle 12, the XR device 13, the smartphone 14, or the home appliance 15 through the cloud network 17, and can assist at least part of AI processing of the connected AI devices 11 to 15. The AI server 16 can learn the artificial neural network according to a machine learning algorithm instead of the AI devices 11 to 15, and can directly store the learning model or transmit the learning model to the AI devices 11 to 15.

The AI server 16 can receive input data from the AI devices 11 to 15, infer a result value for the received input data by using the learning model, generate a response or a control command based on the inferred result value, and transmit the response or the control command to the AI devices 11 to 15. Alternatively, the AI devices 11 to 15 can infer the result value for the input data by directly using the learning model, and generate the response or the control command based on the inferred result value.

<XR Device>

The XR device 13, to which the AI technology is applied, can be implemented by a head-mount display (HMD), a head-up display (HUD) provided in a vehicle, a television, a mobile phone, a smartphone, a computer, a wearable device, a home appliance, a digital signage, a vehicle, a fixed robot, a mobile robot, or the like.

The XR device 13 can analyzes three-dimensional point cloud data or image data acquired from various sensors or external devices, and generate position data and attribute data for the three-dimensional points. The XR device 13 can acquire information related to a surrounding space or a real object, and render to output an XR object to be output. For example, the XR device 100c can output an XR object including additional information related to a recognized object in correspondence to the recognized object The XR device 13 can perform the above-described operations by using the learning model composed of at least one artificial neural network. For example, the XR device 13 can recognize the real object from the three-dimensional point cloud data or the image data by using the learning model, and can provide information corresponding to the recognized real object. Here, the learning model can be directly learned from the XR device 13, or can be learned from the external device such as the AI server 16.

At this time, the XR device 13 can perform the operation by generating the result by directly using the learning model, but sensor information can be transmitted to the external device such as the AI server 200 and the generated result can be received to perform the operation.

[Extended Reality Technology]

Extended Reality (XR) is collectively referred to as Virtual Reality (VR), Augmented Reality (AR), and Mixed Reality (MR). The VR technology provides a real-world object and background only as a CG image, the AR technology provides a virtual CG image on a real object image, and the MR technology is a computer graphic technology that mixes and combines virtual objects into the real world.

The MR technology is similar to the AR technology in that the real object and the virtual object are shown together. However, in the AR technology, the virtual object is used in the form that complements the real object, whereas in the MR technology, the virtual object and the real object are used in an equal manner.

The XR technology can be applied to a head-mount display (HMD), a head-up display (HUD), a mobile phone, a tablet PC, a laptop, a desktop, a TV, a digital signage, and the like. A device to which the XR technology is applied can be referred to as an XR device.

Figure 2:
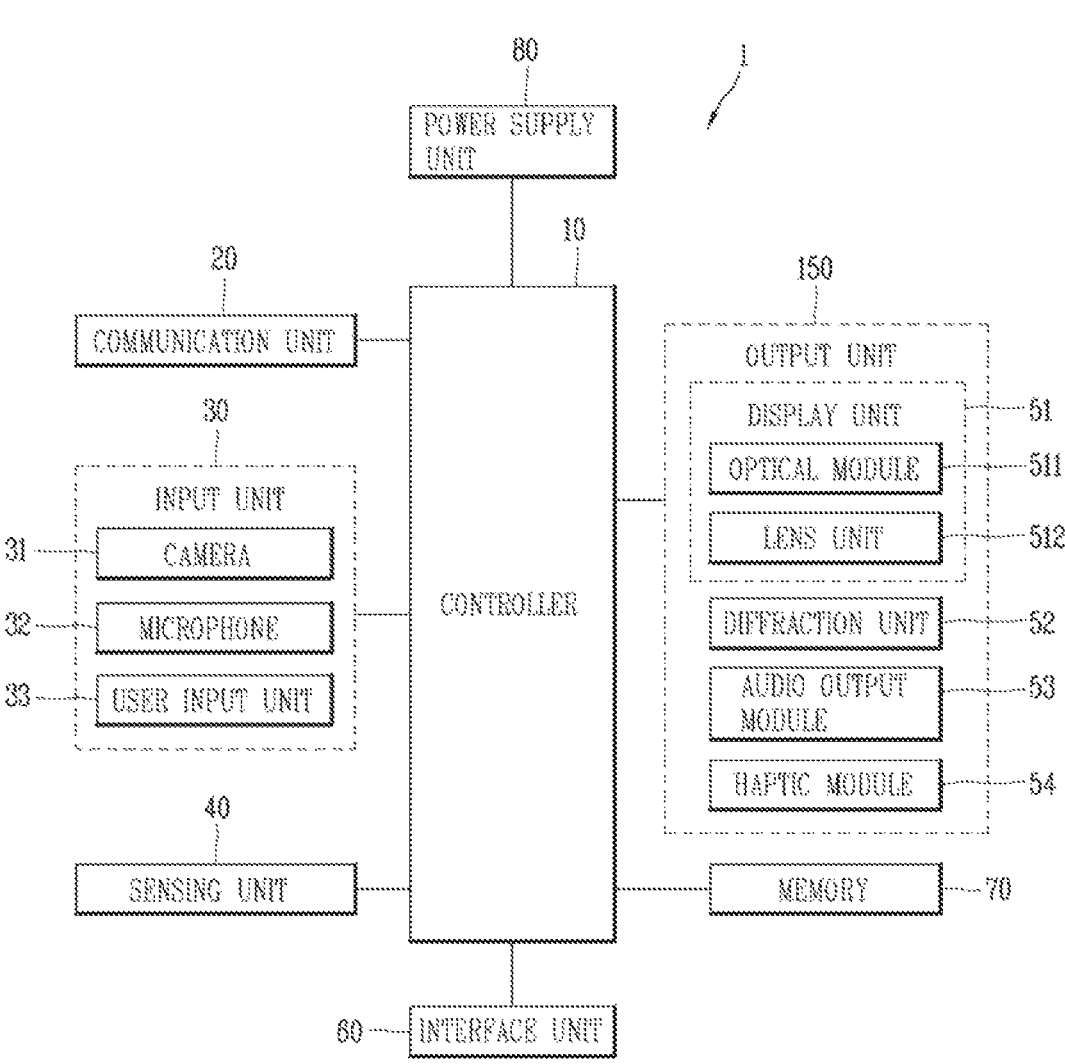
FIG. 2 is a configuration diagram illustrating internal structures of a glasses-type terminal, and a display and a diffraction unit provided on a body part in relation to the present disclosure.

FIG. 2 is a block diagram illustrating a configuration of a glasses-type terminal 1 related to an embodiment of the present disclosure. The glasses-type terminal 1 according to the embodiment can include a communication unit 20, an input unit 30, a sensing unit 40, an output unit 150, an interface unit 60, a memory 70, a controller 10, a power supply unit 80, and the like. FIG. 1 shows the glasses-type terminal 1 having various components, but it can be understood that implementing all of the illustrated components is not a requirement. Greater or fewer components can alternatively be implemented. Although discussed in terms of the glasses-type terminal, embodiments of the present disclosure as applicable to any display device, including head-mount display (HMD), a head-up display (HUD) provided in a vehicle, a television, a mobile phone, a smartphone, a computer, a wearable device, a home appliance, a digital signage, a vehicle, a fixed robot, a mobile robot, a tablet PC, a laptop, a desktop, a TV, a digital signage, or the like.

In more detail, among those components, the communication unit 20 can typically include one or more modules which permit communications such as wireless communications between the glasses-type terminal 1 and a wireless communication system, communications between the glasses-type terminal 1 and another glasses-type terminal, or communications between the glasses-type terminal 1 and an external server. Further, the communication unit 20 can typically include one or more modules which connect the glasses-type terminal 1 to one or more networks. The communication unit 20 can include one or more of a broadcast receiving module, a mobile communication module, a wireless Internet module, a short-range communication module, and a location information module.

The input unit 30 can include a camera 31 or an image input unit for obtaining images or video, a microphone 32, which is one type of audio input device for inputting an audio signal, and a user input unit 33 (for example, a touch key, a mechanical key, and the like) for allowing a user to input information. Data (for example, audio, video, image, and the like) can be obtained by the input unit 30 and can be analyzed and processed according to user commands.

A camera 31 can be provided by at least one in number that is disposed adjacent to at least one of the left eye and the right eye, to capture (take, or photograph, etc.,) an image of a front side. Since the camera 31 is disposed adjacent to the eye, the camera 121 can acquire a scene viewed by the user as an image. In addition, the camera 31 can be disposed on a glass frame supporting the glass to obtain an image of an inside of the glass. In this case, the camera 31 can also obtain information related to the shape of both eyes of the user, for example, the size of both eyes or the position of each pupil, from the image of the inside of the glass.

The sensing unit 40 can typically be implemented using one or more sensors configured to sense internal information of the glasses-type terminal 1, the surrounding environment of the glasses-type terminal 1, user information, and the like. For example, the sensing unit 40 can include at least one of a proximity sensor, an illumination sensor, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 31), a microphone 32, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The glasses-type terminal 1 disclosed herein can be configured to utilize information obtained from one or more sensors, and combinations thereof.

The output unit 150 can be configured to output various types of information, such as audio, video, tactile output, and the like. The output unit 150 can be shown having at least one of a display 51, an audio output module 53, and a haptic module 54. The output unit 150 can further include an optical output module for outputting an optical signal.

Here, the display 51 can include an optical module 511 including, as an image source, at least one light source that emits light for generating a virtual image. The optical module 511 can include various light sources. For example, the optical module 511 can include a laser display, but it need not use only a laser display using a laser diode but can use a micro LED (light emitting diode), a micro OLED (Organic LED), or LCOS (light emitting diode) that emits light having a wider emission wavelength than the laser diode. Alternatively, a Digital Micromirror Device (DMD) with LED or Super Luminescent Diode (SLD) can be included as an image source.

Further, the display 51 can include a lens unit 512 which includes at least one lens for converting light emitted from the optical module 511 into magnified and collimated light. The lens included in the lens unit 512 can include at least one of a concave lens, a convex lens, and a collimating lens, among other others. The concave lens and the convex lens can be used to diverge and magnify light output from the optical module 511 and the collimating lens can be used to convert the light diverged and magnified by the concave lens and the convex lens into collimated light, for example.

Meanwhile, the glasses-type terminal 1 according to the embodiment of the present disclosure can further include a diffraction unit 52 that forms an optical path along which light output from the display 51 goes to an Eye Movement Box (EMB) formed on the glass of the glasses-type terminal 1. For example, when the output unit 150 is provided in a body part formed on a leg part of the glasses-type terminal 1, the diffraction unit 52 can form an optical path along which light is projected from a part of the body part to the glass.

The diffraction unit 52 can include at least one diffraction element. The diffraction unit 52 can include a refraction element that refracts light emitted from the display 51 in a specific direction.

The glass can include a reflection element 301 for forming the EMB on at least a portion thereof. In this case, the light emitted from the display 51 can be refracted by the refraction element to be projected to the reflection element 301, and the projected light can be reflected by the reflection element 301, thereby creating a virtual image identifiable by the user on the reflection element 301.

Here, the reflection element 301 formed on the glass can be configured as a Holographic Optical Element (HOE). In this case, the HOE 301 can be an element that transmits light incident within a preset incident angle range and reflects light having an incident angle out of the preset incident angle range. In this case, light incident in a direction perpendicular to the user's pupil can be transmitted and light refracted through the refraction element can be reflected, such that a virtual image can be displayed in a see-through type on the glass.

The refraction element can be configured as a single refraction element that refracts light emitted from the display 51 or can be configured as a plurality of reflection elements. In this case, the plurality of reflection elements can form an optical path through which the light emitted from the display 51, for example, the lens unit 512, proceeds to the HOE 301. To this end, the plurality of reflection elements can be arranged such that a first reflection element 303 reflects the light emitted from the display 51 and a second reflection element 302 different from the first reflection element 303 reflects the light reflected from the first reflection element 303 to the HOE 301.

As described above, the HOE has a characteristic of transmitting light incident within a preset incident angle range and reflecting light having an incident angle out of the preset incident angle range. Therefore, when the second reflection element 302 is disposed as the HOE and the second reflection element (HOE) 302 is disposed between the first reflection element 303 and the display 51, light emitted from the display 51 can be incident on the first reflection element 303 through the second reflection element 302 and light reflected by the first reflection element 303 can be reflected by the second reflection element 302, by way of adjusting the incident angle of light.

Accordingly, a first path through which light is incident from the display 51 to the first reflection element 303 and a second path through which light reflected by the first reflection element 303 is incident to the second reflection element 302 can overlap each other, thereby more reducing a required size of the diffraction unit 52 through the overlap of the optical paths.

In the following description, in order to distinguish the HOE 301 provided on the glass and the HOE used as the second reflection element 302, the former, for example, the HOE 301 provided on the glass can be referred to as a first HOE 301, and the latter, for example, the HOE used as the second reflection element 302 can be referred to as a second HOE 302.

The interface unit 160 serves as an interface with various types of external devices that are coupled to the spectacle-type terminal 1. The interface unit 160, for example, can include any of wired or wireless ports, external power supply ports, wired or wireless data ports, memory card ports, ports for connecting a device having an identification module, audio input/output (I/O) ports, video I/O ports, earphone ports, and the like. In some cases, the glasses-type terminal 1 can perform assorted control functions related to a connected external device, in response to the external device being connected to the interface unit 60.

The audio output module 53 can receive audio data from the wireless communication unit 20 or output audio data stored in the memory 170 during modes such as a signal reception mode, a call mode, a record mode, a voice recognition mode, a broadcast reception mode, and the like. The audio output module 53 can output audio signals related to functions performed in the spectacle-type terminal 1. The audio output module 53 can also be implemented as a receiver, a speaker, a buzzer, or the like.

The audio output module 53 can be configured to transmit sound in a general sound output manner or a bone-conduction mode. In case where the audio output module 53 is implemented in the bone-conduction manner, when the user wears the glasses-type terminal 1, the audio output module 53 is brought into close contact with the user's head and vibrates a skull to transmit sound.

The haptic module 54 can generate various tactile effects that the user feels, perceives, or otherwise experiences. A typical example of a tactile effect generated by the haptic module 54 is vibration. The strength, pattern and the like of the vibration generated by the haptic module 54 can be controlled by user selection or setting by the controller. In addition, the haptic module 54 can output different types of vibration by combining them or in a sequential manner, and can be provided by two or more in number depending on the configuration of the glasses-type terminal 1.

The interface unit 60 serves as an interface for external devices to be connected with the glasses-type terminal 1. For example, the interface unit 60 can receive data transmitted from an external device, receive power to transfer to elements and components within the glasses-type terminal 1, or transmit internal data of the glasses-type terminal 1 to such an external device. The interface unit 60 can include wired or wireless headset ports, external power supply ports, wired or wireless data ports, memory card ports, ports for connecting a device having an identification module, audio input/output (I/O) ports, video I/O ports, earphone ports, or the like.

The memory 70 can store programs to support operations of the controller 10 and store input/output data (for example, phonebook, messages, still images, videos, etc.). The memory 70 can store data related to various patterns of vibrations and audio which are output through the haptic module 54 or the audio output module 53.

The controller 10 typically functions to control an overall operation of the mobile terminal 1, in addition to the operations associated with the application programs. For example, the controller 10 can set or release a lock state for restricting a user from inputting a control command with respect to applications when a status of the glasses-type terminal 1 meets a preset condition.

In addition, the controller 10 can perform control and processing related to voice calls, data communications, video calls, and the like. In addition, the controller 10 can control one or a combination of those components in order to implement various example embodiments disclosed herein.

The power supply unit 80 receives external power or provides internal power and supply the appropriate power required for operating respective elements and components included in the mobile terminal 100 under the control of the control unit (or controller) 10. The power supply unit 80 can include a battery, which is typically rechargeable or be detachably coupled to the terminal body for charging. In addition, the battery can be recharged with power supplied from an external charger through a connection port, or can be recharged from an external wireless power transmitter based on an inductive coupling method based on magnetic induction or an electromagnetic resonance phenomenon.

Figure 3:
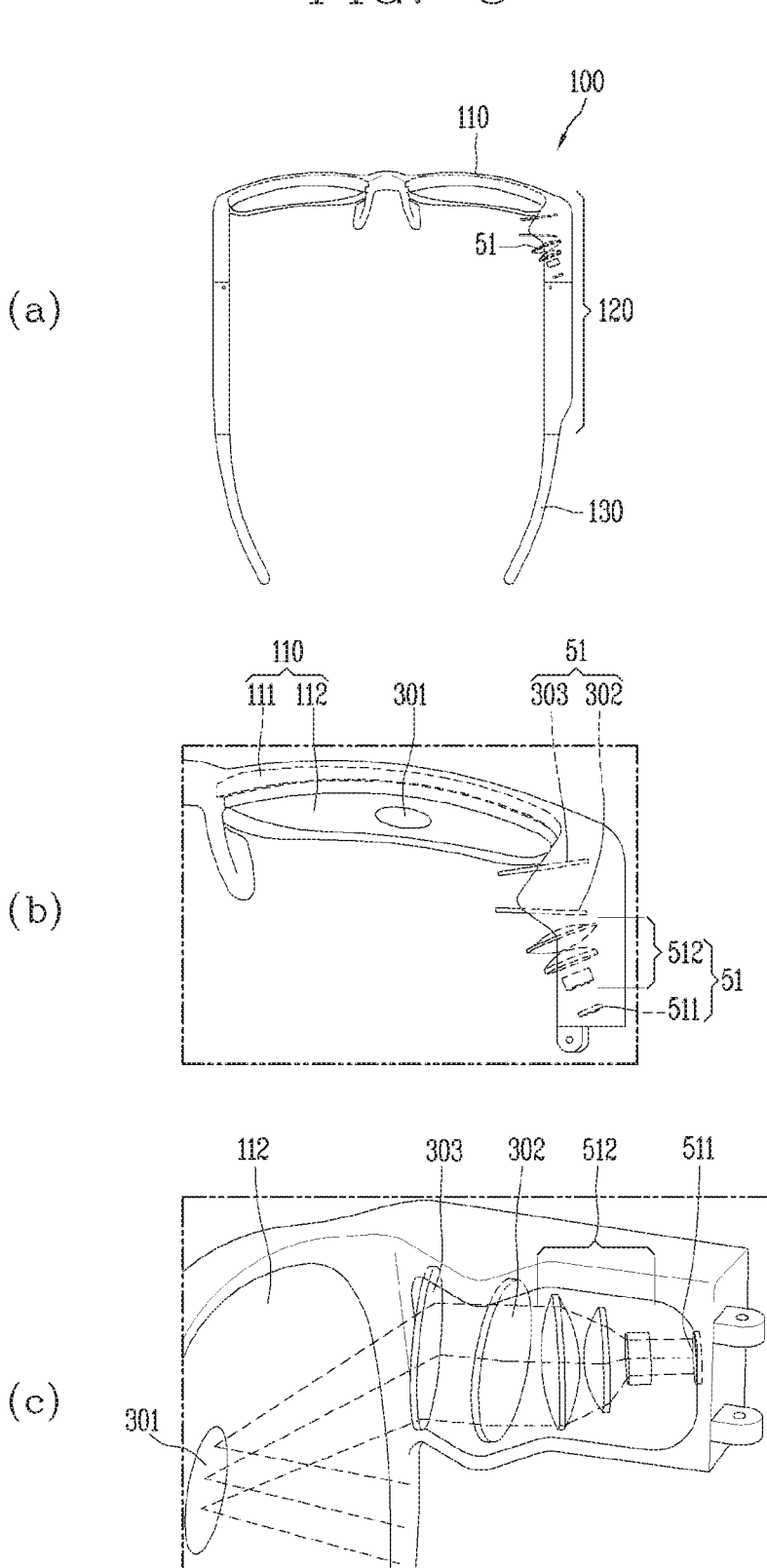
FIG. 3 is a configuration diagram illustrating internal structures of a glasses-type terminal, and a display and a diffraction unit provided on a body part in relation to the present disclosure.

FIG. 3 is a configuration diagram illustrating internal structures of a glasses-type terminal, and a display and a diffraction unit provided on a body part in relation to the present disclosure. (a) of FIG. 3 illustrates a glasses-type terminal 1 according to an embodiment of the present disclosure. The glasses-type mobile terminal 1 can be wearable on a head of a human body and can include a frame unit for wearing. The frame unit can be formed of a flexible material to facilitate the wearing. The frame unit can include a first frame part 110 supporting each glass and a second frame part 130 supporting the main body of the glasses-type terminal.

First, the second frame part 130 can include a leg portion (hereinafter, referred to as a leg part) of the glasses-type terminal 1, can be supported on the head of the human body, and can define a space for providing a body part 120 to which various components are mounted. The body part 120 can be mounted in the space defined in the second frame part 130.

The first frame part 110 can include a glass 112 having a lens covering at least one of left and right eyes and a glass frame 111 formed to support and fix the glass 112. The glass 112 can be mounted to be detachable from the glass frame 111.

Meanwhile, various electronic components provided in the body part 120 can be electronic components corresponding to each component shown in FIG. 1. Therefore, the body part 120 can include not only the controller 10, the communication unit 20, the input unit 30, the sensing unit 40, and the memory 70 connected to the controller 10, but also the output unit 150. In this case, the display 51 and the diffraction unit 52 outputting light for displaying a virtual image on the glass 112 can be provided on the body part 120, and an optical path through which light is projected from the display 51 to the adjacent glass 112 through the diffraction unit 52 can be formed by the body part 120.

(b) and (c) of FIG. 3 are example diagrams for explaining the configurations of the display 51 and the diffraction unit 52 provided in the body part 120. Referring to (b) and (c) of FIG. 3, (b) and (c) of FIG. 3 illustrate the display 51 that includes a light source that emits an image source, namely, an optical module 511, and a lens unit 512 having a plurality of lenses. Further, the configuration of the diffraction unit 52 that includes a first reflection element 303, a second reflection element 302, and a first holographic optical element (HOE) 301 is disclosed.

Referring to those drawings, in the glasses-type terminal 1 according to the embodiment of the present disclosure, the first HOE 301 can be disposed in one region of the glass 112. In this case, the one region of the glass 112 on which the first HOE 301 is disposed is a region where light projected through the diffraction unit 52 is reflected to display a virtual image, and can create a region, namely, an Eye Movement Box (EMB) in which the user can see the displayed virtual image with naked eyes.

In the glasses-type terminal 1 according to the embodiment of the present disclosure, as illustrated in (b) and (c) of FIG. 3, the reflection element 303 and the second reflection element 302 can be disposed between the lens unit 512 of the display 51 and the first HOE 301. Here, the second reflection element 302 can be a hologram optical element (second HOE).

Figure 4:
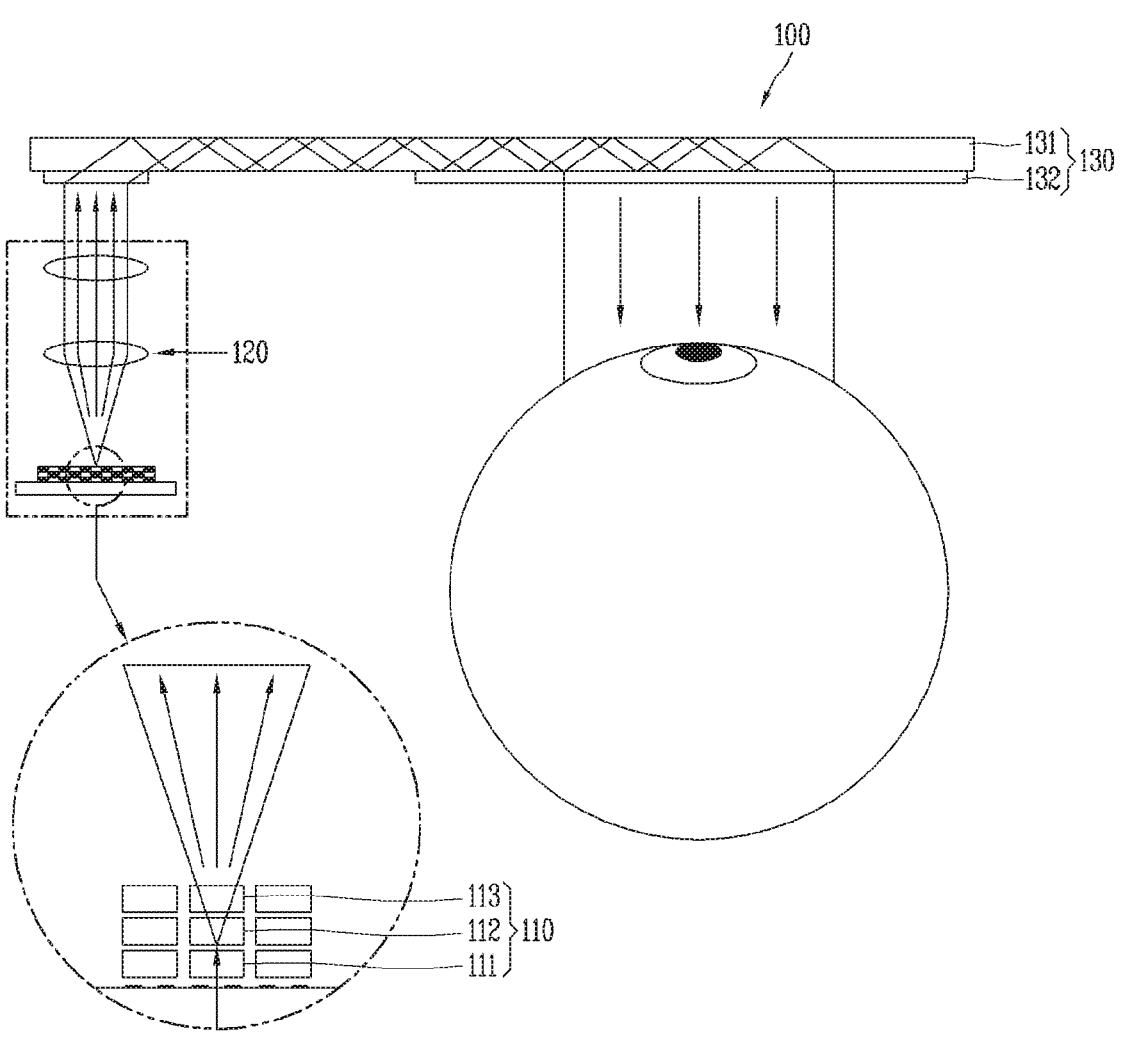
FIG. 4 illustrates a structure of a wearable display device according to the present disclosure.

The display device of FIGS. 1 to 3 can also be applied to wearable display devices. In relation to this, FIG. 4 illustrates a structure of a wearable display device according to the present disclosure. The display device of FIG. 4 can be a wearable display device that displays Augmented Reality (AR) images. All components of each display device according to all embodiments of the present disclosure are operatively coupled and configured.

Referring to FIG. 4, the display device 100 can include a light source part 110, an optical engine 120, and a display 130. The light source part 110 can be configured to generate light that meets characteristics of an optical system at a light emitting point. The light source part 110 can be configured to generate and emit red light, green light, and blue light. The light source part 110 can be implemented as a micro display, but need not be limited thereto. The light source part 110 including a plurality of light sources can be implemented as a display device having a light emitting structure according to the present disclosure.

The light source part 110 can have a structure in which light emitting structures 111 to 113 configured to emit red light, green light, and blue light are stacked in a vertical direction, but need not be limited thereto. As another example, the light source part 110 can have a structure in which the light emitting structures configured to emit red light, green light, and blue light are disposed adjacent to each other on the same plane.

The optical engine 120 can receive light emitted from the light source part 110 and transfer the light to the display 130. The optical engine 120 can include a display and a plurality of lenses. The display 130 is configured to display image light transmitted from the optical engine 120 to a user through the display device 1000.

The display 130 can include a waveguide 131 and a grating structure 132. The waveguide 131 can be configured such that an image light signal from the optical engine 120 is transmitted in one axial direction through the inside thereof. The waveguide 131 is configured such that incident light incident at a predetermined angle or more is totally reflected inside the waveguide 131 to be transmitted in the one axial direction of the waveguide 131. The grating structure 132 can be formed on one surface of the waveguide 131 to display an AR image to the user's eyes. The waveguide 131 can correspond to a display region of the display 130. The grating structure 132 can form AR image light that can be recognized by the user's eyes through the display 130.

An image display device such as AR glasses can transfer light generated by the optical engine 120 to the user's eyes through the waveguide 131 of the image display optical system. Image light proceeding within the waveguide 131 can be externally coupled through the grating structure 132 on the one surface of the waveguide 131 to be transmitted to the user's eyes. In this regard, light emission efficiency characteristics vary depending on a polarization state (Transverse Electric (TE) or Transverse Magnetic (TM)) of light, which affects image quality. On the other hand, when a non-polarized light signal is incident on the image display optical system, difficulties can arise in controlling an emission amount profile.

A transverse electric (TE) optical signal inside the waveguide 131 is a signal that proceeds in a direction perpendicular to a direction of an electric field. A transverse magnetic (TM) optical signal inside the waveguide 131 is a signal that proceeds in a direction perpendicular to a direction of a magnetic field. An optical signal can be formed in a TE mode or a TM mode by changing a wavelength band of an optical signal transmitted into the waveguide 131.

Accordingly, it is necessary to secure the performance of the image display device by making light polarized by the optical engine 120 incident on the image display optical system with high efficiency. To this end, it can be advantageous that a light source of a micro-display of the optical engine 120 emits polarized light. A structure in which the light source emits resonance can be advantageous in terms of securing straightness and polarization of light. Accordingly, it is necessary to design a structure in which the light source emits light that meets the characteristics of the image display optical system based on the resonance emission. The design of such a light emission structure is required for all light sources of red light, green light, and blue light, and it is necessary to ensure that each light source has the same polarization.

Figure 5:
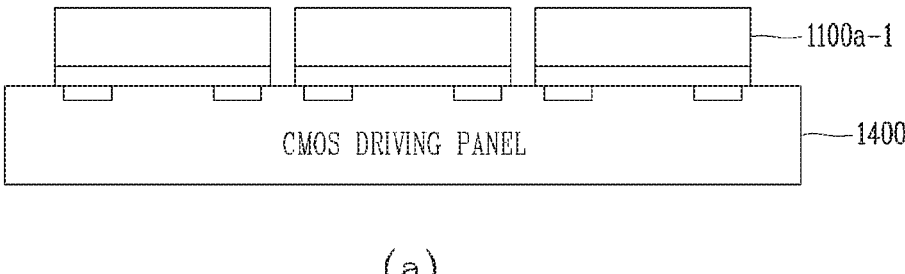
FIG. 5 illustrates a stacked structure of a light emitting layer of a display device according to one example.
Figure 5:
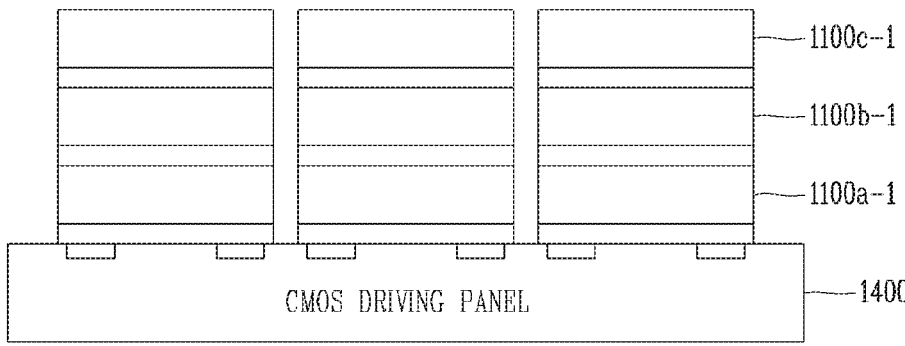

Hereinafter, a display device according to the present disclosure will be described in detail with reference to the accompanying drawings. FIG. 5 illustrates a stacked structure of a light emitting layer of a display device according to one example. Referring to (a) of FIG. 5, a first light emitting layer 1100a-1 that is configured as an AlGaInP LED can be first formed on top of a CMOS driving panel 1400. Referring to (b) of FIG. 5, a display stacked structure can be formed in the order of a first light emitting layer 1100a-1, a second light emitting layer 1100b-1, and a third light emitting layer 1100c-1 from an upper part or a surface of the CMOS driving panel 1400. In this regard, the light emitting layers can be disposed in a red-green-blue color order from the bottom of the display device. Accordingly, the first light emitting layer 1100a-1, the second light emitting layer 1100b-1, and the third light emitting layer 1100c-1 can define a red-light emitting layer, a green-light emitting layer, and a blue-light emitting layer, respectively, though such is not required, and different orders of color layers are within the scope of this invention, such as the green-light emitting layer, the blue-light emitting layer and the red-light emitting layer in order; or the blue-light emitting layer, the red-light emitting layer and the green-light emitting layer in order; or the red-light emitting layer, the blue-light emitting layer and the green-light emitting layer in order; or the blue-light emitting layer, the green-light emitting layer and the red-light emitting layer in order; or the green-light emitting layer, the red-light emitting layer and the blue-light emitting layer. Further, colors other than red, green, and blue can be use, such as white or yellow-green, among others in various combinations.

When an AlGaInP material is used for a red LED in the display stacked structure of FIG. 5, the following two issues arise in performance and production of an ultra-high definition micro display. In this regard, an InGaN material can be used as a Blue/Green LED. First, an issue of light efficiency of red light can occur. In the case of AlGaInP LEDs, as a size of a chip decreases, light efficiency can decrease rapidly compared to InGaN LEDs. Accordingly, a structure in which the AlGaInP LED is disposed at the lowest end is disadvantageous in terms of emission efficiency of red light.

As illustrated in (a) of FIG. 5, after the first light emitting layer 1100a-1 that is the AlGaInP LED is first formed, the second and third light emitting layers 1100b-1 that are the GaN LEDs can be formed as illustrated in (b) of FIG. 5. In this way, when the AlGaInP process and the GaN process are used, a possibility of contamination of a GaN facility or an equipment operation efficiency degradation issue can occur in a foundry production facility. In order to implement an ultra-high definition LEDoS panel of 5000 ppi or more based on stacked LEDs, a semiconductor processing facility with a precision of 180 nm or less is required. GaN semiconductor production foundry facilities can process the GaN material with a required level of precision. AlGaInP LED production facilities need to be operated separately from the GaN device production facilities due to a contamination issue.

When the AlGaInP LED is disposed at the lowest end of the panel, the following issues can occur because the AlGaInP material is included in the panel in the preceding process. During the GaN LED process after the AlGaInP LED process is completed, there is a possibility of contamination of the GaN facilities and an occurrence of related issues. Basically, a separate production line for the AlGaInP LED process is required, and an additional InGaN LED process line is also separately required to avoid the contamination issue from the AlGaInP and related materials in subsequent processes. Therefore, the use together with a power semiconductor production line is not possible, which can deteriorate equipment operation efficiency.

To solve the red light efficiency issue, the GaN facility contamination issue, and the equipment operation efficiency deterioration issue, hereinafter, a display device having a light emitting structure according to the present disclosure will be described. In this regard, the aspects of this specification can be summarized as follows.

One aspect of the present disclosure is to provide a display device having a light emitting structure and a method for manufacturing the same. Another aspect of the present disclosure is to solve a problem that light efficiency of a red-light emitting element is lower than those of other light emitting elements. Still another aspect of the present disclosure is to solve a GaN equipment contamination issue when a red AlGaInP LED is formed first and then a green or blue GaN LED is formed. Still another aspect of the present disclosure is to solve an equipment operation efficiency degradation issue when a red AlGaInP LED is formed first and then a green or blue GaN LED is formed.

Still another aspect of the present disclosure is to easily arrange various electrodes and connection wires as needed in a light emitting structure. Still another aspect of the present disclosure is to solve a short-circuit risk issue between p-n regions when forming an ultra-fine electrode structure. Still another aspect of the present disclosure is to improve light efficiency by eliminating an influence of excitons due to a metal or absorption of internally formed photon energy into the metal.

Still another aspect of the present disclosure is to contribute to efficiency improvement by removing damage due to internal etching that involves when forming wires inside an LED. Still another aspect of the present disclosure is to more facilitate the formation of an optical resonance mode. Still another aspect of the present disclosure is to control and align polarization of light emitted from red, green, and blue-light emitting bodies when forming a stacked light emitting structure.

Figure 6A:
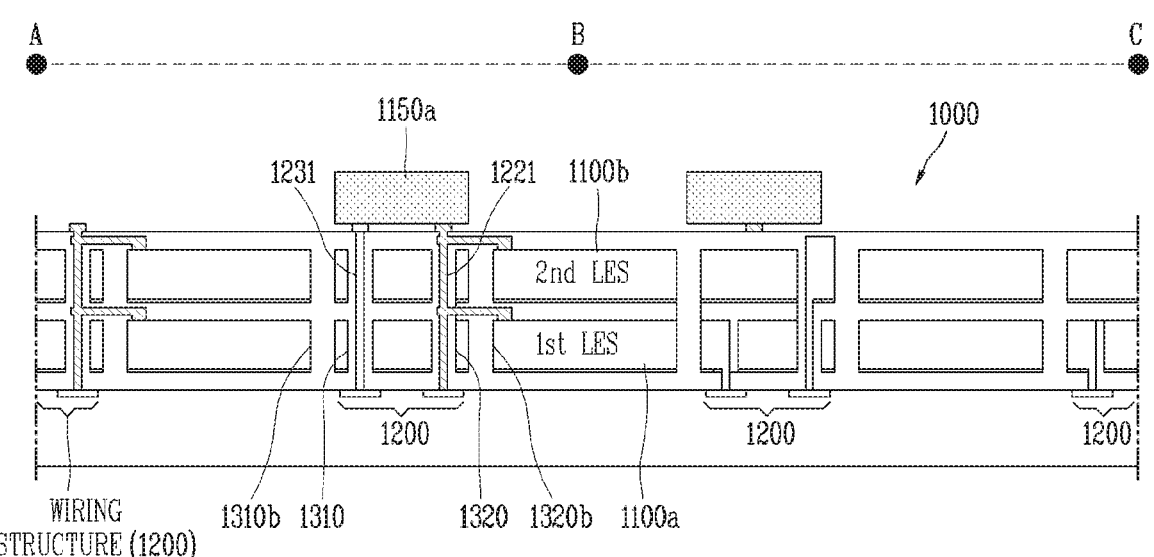
FIGS. 6A and 6B are a sectional view and a front view, respectively, illustrating light emitting structures and a wiring structure of a display device according to the present disclosure.
Figure 6B:
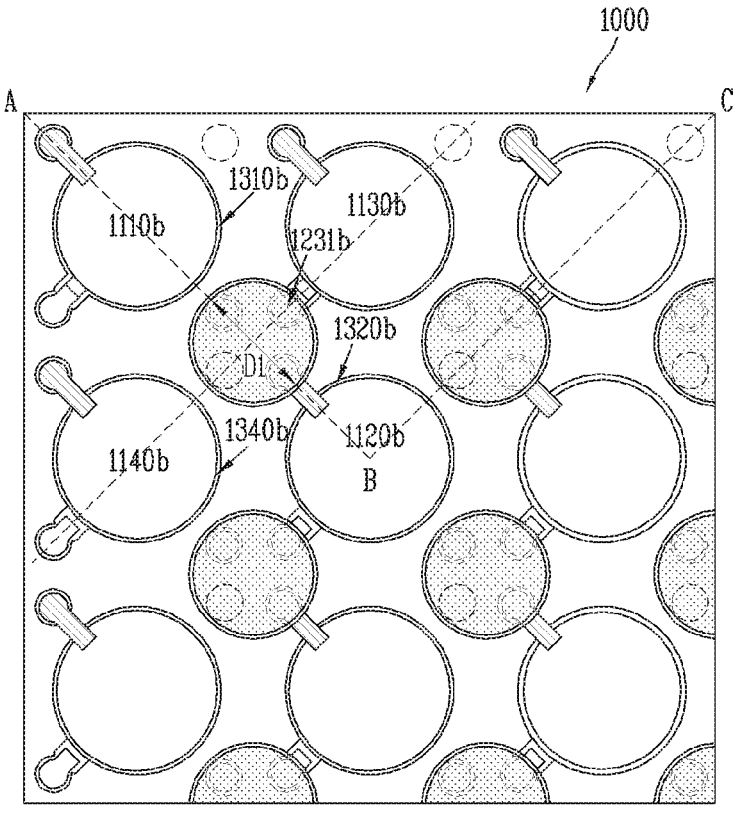

A display device having a light emitting structure according to the present disclosure for achieving those aspects will be described with reference to the drawings. In this regard, FIGS. 6A and 6B are a sectional view and a front view, respectively, illustrating light emitting structures and a wiring structure of a display device according to the present disclosure. The structure in which the light emitting structures of FIG. 6A are stacked is shown in a sectional view taken along a line AB in one axial direction and a line BC perpendicular to the one axial direction in the front view of FIG. 6B.

Referring to FIGS. 6A and 6B, a display device 1000 having a light emitting structure can include first light emitting structures 1100*a*, second light emitting structures 1100*b*, and light emitting elements 1150*a*. The first light emitting structures 1100*a* can be stacked on a first insulating layer 1301 on a driving panel 1400. The second light emitting structures 1100*b* can be stacked on a second insulating layer 1302 on top of the first light emitting structures 1100*a*. The second light emitting structures 1100*b* can be stacked in alignment with the first light emitting structures 1100*a*.

The first light emitting structures 1100*a* and the second light emitting structures 1100*b* can emit green light and blue light, respectively, but need not be limited thereto. Accordingly, one of the first light emitting structures 1100*a* and the second light emitting structures 1100*b* can emit green light and the other can emit blue light. The first light emitting structures 1100*a* and the second light emitting structures 1100*b* can be formed in a cylindrical shape. In this regard, those structures can be formed in the cylindrical shape to optimize light efficiency and minimize interference between adjacent light sources, but need not be limited thereto and can vary depending on applications. Accordingly, the first light emitting structures 1100*a* and the second light emitting structures 1100*b* can be disposed so that centers of the first light emitting structures 1100*a* and centers of the second light emitting structures 1100*b* are aligned with each other.

The shapes of the first light emitting structures 1100*a* and the second light emitting structures 1100*b* need not be a cylindrical shape, but can by oval, semicircular, triangular, rectangular, octagonal or other geometric shape in plan view, or spherical or hemispheric in other views, for example.

The first light emitting structures 1100*a* and the second light emitting structures 1100*b* can have the same size and can be of the same shape, but such is not required. For example, the first light emitting structures 1100*a* and the second light emitting structures 1100*b* can be of the same shape, but of different sizes or can be of different shapes and sizes. Regarding the different sizes, although the first light emitting structures 1100*a* and the second light emitting structures 1100*b* can be in the cylindrical shape as shown in FIGS. 6A and 6B, but in various embodiments of the disclosure, the first light emitting structures 1100*a* and the second light emitting structures 1100*b* can be of different sizes, whereby one of the first light emitting structures 1100*a* and the second light emitting structures 1100*b* can have a smaller size (e.g., a smaller diameter, area, volume and/or surface area) than the other. In the instance of different sizes, the first light emitting structures 1100*a* and the second light emitting structures 1100 can have the same axial alignment so that the centers of the first light emitting structures 1100*a* and the second light emitting structures 1100*b* are aligned. However, such is not required, so that the first light emitting structures 1100*a* and the second light emitting structures 1100*b* can have centers that are offset from each other. Such an offset of the centers of the first light emitting structures 1100*a* and the second light emitting structures 1100*b* can also occur when the first light emitting structures 1100*a* and the second light emitting structures 1100*b* are of the same size or shape, so that the first light emitting structures 1100*a* and the second light emitting structures 1100*b* at least partially overlap.

In embodiments of the disclosure in which the first light emitting structures 1100*a* and the second light emitting structures 1100*b* can have different shapes from each other, the size (e.g., diameter, area, volume and/or surface area, for example) can be the same or different. When the first light emitting structures 1100*a* and the second light emitting structures 1100 have different shapes, the first light emitting structures 1100*a* and the second light emitting structures 1100 can have the same axial alignment so that the centers of the first light emitting structures 1100*a* and the second light emitting structures 1100*b* are aligned. However, such is not required, so that the first light emitting structures 1100*a* and the second light emitting structures 1100*b* can have centers that are offset from each other.

In embodiments of the disclosure, one or both of the first light emitting structures 1100*a* and the second light emitting structures 1100*b* can be provided as at least two sub light emitting structures that are commonly connected to a p-electrode and an n-electrode. Each of the at least two sub light emitting structures can be a redundancy when one of the at least two sub light emitting structures has a defect, and is unable to emit light. With the redundancy, a pixel with the at least two sub light emitting structure is able to emit some light, which may be compensated by emission in surrounding pixels or the overlapped light emitting structure. Although described as being commonly connected to the p-electrode and the n-electrode, each of the at least two sub light emitting structures can be driven by separate p-electrodes in other embodiments. The at least two sub light emitting structures may have the same shape, size and shapes as each other, or can have different thicknesses, shapes and/or sizes from each other. The at least to sub light emitting structures need not be coplanar in the first light emitting structures 1100*a* and/or the second light emitting structures 1100*b*, but can be offset in the vertical direction as well.

In various embodiments of the present disclosure, thicknesses of the first light emitting structures 1100*a* and the second light emitting structures 1100*b* can be the same or different. For example, when the same, the thickness of the first light emitting structures 1100*a* and the second light emitting structures 1100*b* can determined on deposition time or rate of materials and layers that form the first light emitting structures 1100*a* and the second light emitting structures 1100*b*. Further, when different, the thicknesses of the first light emitting structures 1100*a* and the second light emitting structures 1100*b* can be adjusted to change an amount of light or fine-tune a wavelength of light that can be emitted from the first light emitting structures 1100*a* and the second light emitting structures 1100*b*

The light emitting elements 1150*a* can be stacked on a third insulating layer 1303 on the top of the second light emitting structures 1100*b*. The light emitting elements 1150*a* can be stacked with being spaced apart from the centers of the second light emitting structures 1100*b*. The light emitting elements 1150*a* are configured as light emitting elements emitting red light. Since the light emitting elements 1150*a* are disposed above the first and second light emitting structures 1100*a* and 1100*b* in an offset structure, a red light efficiency issue can be solved while minimizing interference with different light.

The first light emitting structures 1100*a*, the second light emitting structures 1100*b*, and the light emitting elements 1150*a* can constitute a first layer, a second layer, and a third layer, respectively, to form a stacked structure in a vertical direction. Each of the light emitting elements 1150*a* can include a p-electrode 1231 and an n-common electrode 1221. The p-electrode 1231 of the light emitting element 1150*a* can penetrate an insulating structure 1310 in which the first insulating layer 1301 to the third insulating layer 1303 are vertically connected. Accordingly, the p-electrode 1231 of the light emitting element 1150a can be connected to one of the p-electrodes of the driving panel 1400.

According to an embodiment, the light emitting element 1150a can be implemented as a chip having a first diameter. The light emitting element 1150a can be implemented as a flip-chip having the first diameter. The flip chip 1150a disposed on the third layer can be disposed between first and second light emitting elements 1110b and 1120b, which are two of the second light emitting structures disposed in one axial direction. The first and second light emitting elements 1110b and 1120b constituting the second light emitting structures 1100b can be disposed on the second layer. When the first light emitting structures 1100a, second light emitting structures 1100b, and light emitting elements 1150a respectively emit green, blue and red light, for example, first and second light emitting elements 1110b and 1120b, and the flip chip 1150a adjacent thereto can form a pixel. Accordingly, a plurality of pixels can be provided in the display device 1000.

The p-electrode 1231 connected to a lower region of the flip chip 1150a can penetrate the insulating structure 1310 to be connected to one of the p-electrodes of the driving panel 1400. The insulating structure 1310 can be spaced apart from an insulating layer 1310b surrounding the first light emitting element 1110b, and the p-electrode 1231 can penetrate the insulating structure 1310. The p-electrode 1231 can be located outside the insulating layer 1310b surrounding the first light emitting element 1110b. The p-electrode 1231 can be located inside a projected diameter of the flip chip 1150a, such as being directly below the flip chip 1150a, and between the flip chip 1150a and the driving panel 1400. This can increase a light emitting region of the flip chip 1150a connected to the p-electrode 1231 and minimize interference with adjacent light emitting structures.

The n-common electrode 1221 connected to the lower region of the flip chip 1150a can penetrate an insulating structure 1320 to be connected to an n-common electrode of the driving panel 1400. The second insulating structure 1320 can be spaced apart from an insulating layer 1320b surrounding the second light emitting element 1120b, and the n-common electrode 1221 can penetrate the second insulating structure 1320. The n-common electrode 1221 can be located outside the insulating layer 1320b surrounding the second light emitting element 1120b. The n-common electrode 1221 can be located inside the projected diameter of the flip chip 1150a, such as being directly below the flip chip 1150a, and between the flip chip 1150a and the driving panel 1400. This can increase a light emitting region of the flip chip 1150a connected to the n-common electrode 1221 and minimize interference with adjacent light emitting structures.

The flip chip 1150a can be disposed between third and fourth light emitting elements 1130b and 1140b, which are two of the second light emitting structures disposed in another axial direction of a line BC perpendicular to the one axial direction of the line AB. One region of the flip chip 1150a in the another axial direction can be disposed above the p-electrode 1231b of the third light emitting element 1130b. Another region of the flip chip 1150a in the another axial direction can be spaced apart from an insulating layer 1340b surrounding the fourth light emitting element 1140b. The n-common electrode 1221 connected to the flip chip 1150a can be connected to the n-electrode of the first light emitting structure 1100a and the n-electrode of the second light emitting structure 1100b.

In summary, the display device 1000 having the light emitting structure according to the present disclosure can be configured as a stacked light emitting structure in which a plurality of light emitting layers are bonded together by a bonding structure. The light emitting structure of the first light emitting layer and the second light emitting layer can include the first light emitting structure 1100a and the second light emitting structure 1100b. The light emitting structure can include the first light emitting structure 1100a and the second light emitting structure 1100b and a wiring structure 1200 disposed adjacent to the first light emitting structure 1100a and the second light emitting structure 1100b. In various embodiments of the present disclosure, one or both of the first light emitting structure 1100a and the second light emitting structure 1100b can be structures that are epitaxially grown, but in other embodiments, light emitting elements thereof can premade chips that are placed at specific locations of the first light emitting structure 1100a and the second light emitting structure 1100b A unit light emitting layer can include a light emitting structure 1100 corresponding to a core and a wiring structure 1200 corresponding to a shell surrounding the core. The light emitting structure 1100 is a structure for light emission, and can include a light emitting body 1110 and a plurality of electrodes. The wiring structure 1200 is a structure for wiring for injecting charge into the corresponding light emitting structure 1100. The wiring structure 1200 can include an upper electrode, a lower electrode, and a wiring structure (connection wire) connecting each electrode. An insulating structure 1310 made of a dielectric material can be interposed between the light emitting structure 1100 and the wiring structure 1200. The insulating structure 1300 can facilitate arrangement of the connection wire between the light emitting structure 1100 and the wiring structure 1200.

The third light emitting structure 1120, which can be the third light emitting layer, can be implemented as an array of chips, but can also be epitaxially grown, in different chambers. Two electrodes for current injection can be disposed on bottom of each LED implemented as the array of chips. The arrays of the third light emitting structure 1120 of the third light emitting layer can be disposed on top of the wiring structure of the second light emitting layer. In the arrays of the third light emitting structure 1120 of the third light emitting layer, two electrodes disposed on the bottom can be connected to the first and second electrodes disposed on the top of the second light emitting structure 1100b as the second light emitting layer. The first and second electrodes can be included respectively in two adjacent pixels of the second light emitting structure 1100b. In this regard, the first or second electrode can be implemented as a common electrode.

The insulating structure 1310 made of the dielectric material can be inserted between the light emitting structures 1100a and 1100b and the wiring structure 1200 to facilitate the arrangement of the connection wire between the light emitting structures 1100a and 1100b and the wiring structure 1200. A dielectric material can be used as a bonding structure between the light emitting structures and the wiring structure, but need not be limited thereto, and can also perform a function, like a distributed brag reflector (DBR), of selectively transmitting reflecting light having a specific wavelength. LEDs, OLEDs, LDs, or other light emitting elements can be used as light emitting bodies of the light emitting structures 1100a and 1100b, and the light emitting element can emit light when current is applied through a plurality of electrodes. Surfaces of the light emitting bodies of the light emitting structures 1100a and 1100b can be covered with a dielectric layer as needed, and the dielectric layer can be implemented as a passivation layer having a passivation function. The light emitting bodies of each of the light emitting structures 1100*a* and 1100*b* can use the same type of light emitting element such as LEDs, OLEDs, LDs, or other, but such is not required, so that the type of light emitting element for the light emitting structures 1100*a* and 1100*b* can be different.

Meanwhile, the light emitting structure according to the present disclosure can be applied to implement an ultra-high definition display panel. In this regard, a method of forming an LED light emitting element through a semiconductor exposure process is more advantageous in realizing ultra-high definition than a method of manufacturing LED arrays and aligning and attaching the LED arrays to pixel micro-electrodes of a CMOS driving panel. In this regard, the display device having the light emitting structure according to the present disclosure can be implemented as an ultra-high definition display panel by transferring a light emitting layer to a CMOS driving panel and then forming an LED light emitting element through a precise semiconductor exposure process.

Figure 7A:
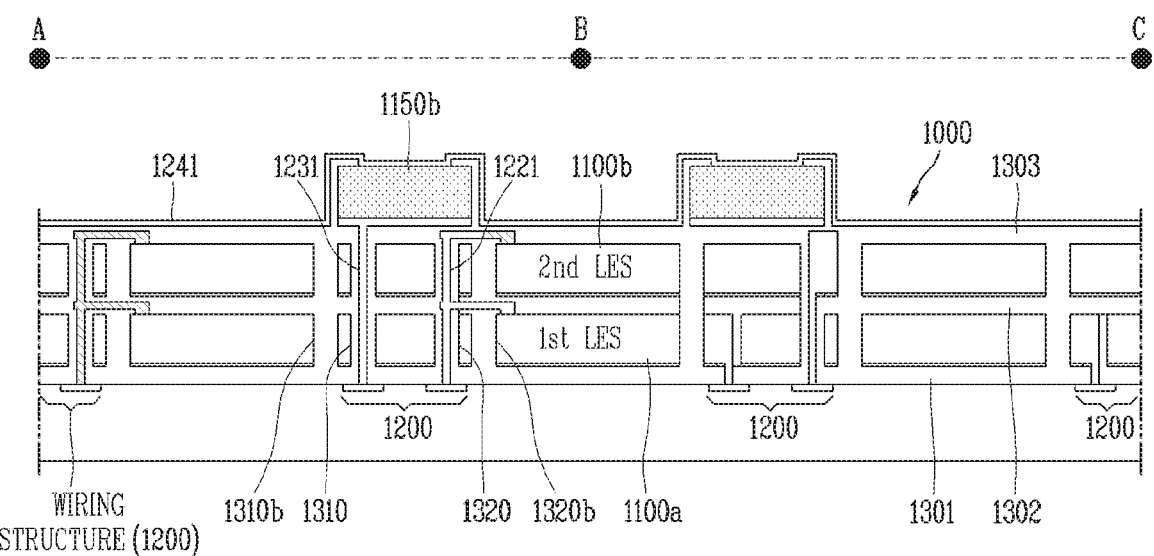
FIGS. 7A and 7B are a sectional view and a front view, respectively, illustrating light emitting structures and a wiring structure of a display device according to an embodiment.
Figure 7B:
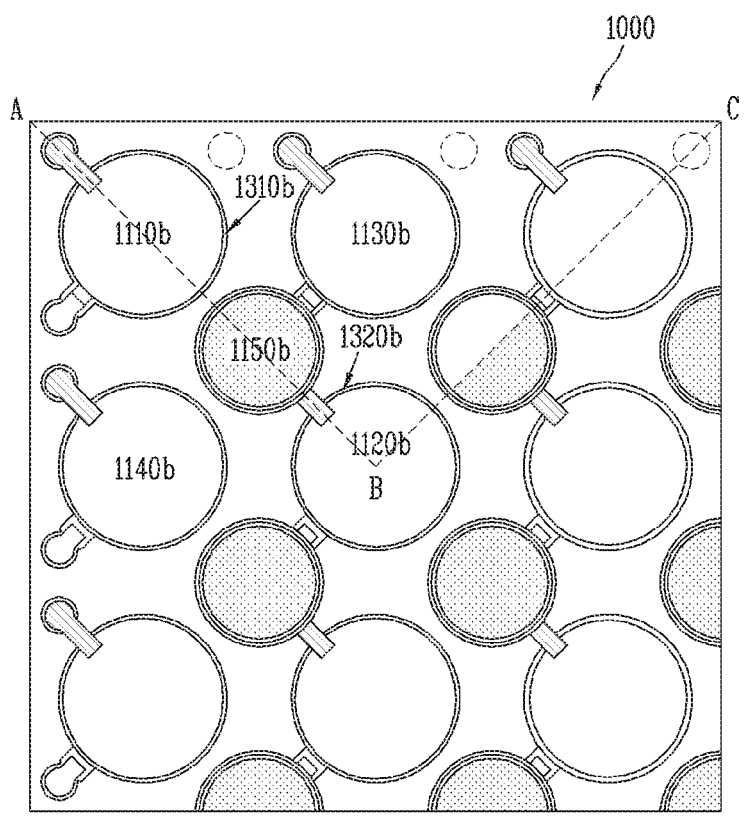

In the display device having the light emitting structure according to the present disclosure, the light emitting elements can be implemented as vertical LED chips having electrodes disposed in a vertical structure. The vertical chip has an excellent advantage in high current compared to a lateral LED chip having a structure in which electrodes are arranged laterally. The vertical chip also has various advantages in terms of light efficiency, high output, operating voltage drop, and thermal characteristics. In this regard, FIGS. 7A and 7B are a sectional view and a front view, respectively, illustrating light emitting structures and a wiring structure of a display device according to an embodiment. The structure in which the light emitting structures of FIG. 7A are stacked is shown in a sectional view taken along the line AB in one axial direction and the line BC perpendicular to the one axial direction in the front view of FIG. 7B.

Referring to FIGS. 7A and 7B, a display device 1000 having a light emitting structure can include first light emitting structures 1100*a*, second light emitting structures 1100*b*, and light emitting elements 1150*b*. The first light emitting structures 1100*a* can be stacked on a first insulating layer 1301 on a driving panel 1400. The second light emitting structures 1100*b* can be stacked on a second insulating layer 1302 on top of the first light emitting structures 1100*a*. The second light emitting structures 1100*b* can be stacked in alignment with the first light emitting structures 1100*a*. The first light emitting structures 1100*a*, the second light emitting structures 1100*b*, and the light emitting elements 1150*b* can constitute a first layer, a second layer, and a third layer, respectively.

The light emitting element 1150*b* can be disposed in an offset structure to be spaced apart from centers of the first and second light emitting structures 1100*a* and 1100*b*. The light emitting element 1150*b* can be implemented as a chip having a first diameter. The chip 1150*b* disposed on the third layer can be disposed between the first and second light emitting elements 1110*b* and 1120*b*, which are two of the second light emitting structures disposed in one axial direction.

A p-electrode 1231 connected to a lower region of the chip 1150*b* can penetrate an insulating structure 1310 to be connected to one of p-electrodes of the driving panel 1400. The insulating structure 1310 can be spaced apart from an insulating layer 1310*b* surrounding the first light emitting element 1110*b*, and the p-electrode 1231 can penetrate the insulating structure 1310. The p-electrode 1231 can be located outside the insulating layer 1310*b* surrounding the first light emitting element 1110*b*. The p-electrode 1231 can be located inside a projected diameter of the chip 1150*b*, and below the chip 1150*b*. This can increase a light emitting region of the chip 1150*b* connected to the p-electrode 1231 and minimize interference with adjacent light emitting structures.

An n-common electrode 1241 connected to an upper region of the chip 1150*b* can be formed. The n-common electrode 1241 can be stacked on an upper region of a third insulating layer 1303 which is formed in opposite side regions of the chip 1150*b* and a region between the chips 1150*b*. An n-electrode of the first light emitting structure 1100*a* and an n-electrode of the second light emitting structure 1100*b* can be connected to a wiring structure penetrating a second insulating structure 1320 to form an n-common electrode 1221*b*. The second insulating structure 1320 can be spaced apart from an insulating layer 1320*b* surrounding the second light emitting element 1120*b* and the n-common electrode 1221*b* can be formed in the second insulating structure 1320. The chip 1150*b* need not be connected to the n-common electrode 1221*b* and can be connected to the n-common electrode 1241 formed on the upper and side regions. Therefore, the n-common electrode 1221*b* of the first light emitting structure 1100*a* and the second light emitting structure 1100*b* can be formed in a structure that is spaced apart from the n-common electrode 1241 on the upper region of the chip 1150*b*.

In various embodiments of the present disclosure, thicknesses of the first insulating layer 1301, the second insulating layer 1302 and the third insulating layer 1303 can be the same or different. When the same, the thicknesses of the first insulating layer 1301, the second insulating layer 1302 and the third insulating layer 1303 can be provided for ease of deposition and time to deposit or form each of the first insulating layer 1301, the second insulating layer 1302 and the third insulating layer 1303. When different, one or more of the thicknesses of the first insulating layer 1301, the second insulating layer 1302 and the third insulating layer 1303 can be different from that of the others. For example, a thickness of the second insulating layer 1302 can be greater than that of the third insulating layer 1303. Further, the thickness of the first insulating layer 1301 or the second insulating layer 1302 is less than that of the third insulating layer 1303, the thicker thickness of the third insulating layer 1303 can provide a better barrier to contamination in order better protect the first and second light emitting structures 1100*a* and 1100*b*, than that of the second insulating layer 1302, which may need only be thick enough to provide a dielectric or insulating property.

The first light emitting structures 1100*a* and the second light emitting structures 1100*b* need not be arranged parallel to each other, but one may be angled relative to the other in other embodiments. Also, upper and lower surfaces of each of the first light emitting structures 1100*a* and the second light emitting structures 1100*b* need not be flat but can be irregular or have protrusions and depression that can alternate in the first light emitting structures 1100*a* and the second light emitting structures 1100*b*. Additionally, the first light emitting structures 1100*a* and the second light emitting structures 1100*b* need not overlap in only the vertical direction but can also overlap in the horizontal direction, whereby a portion of the first light emitting structures 1100*a* can protrude upward and/or a portion of the second light emitting structures 1100*b* can protrude downward.

Figure 8A:
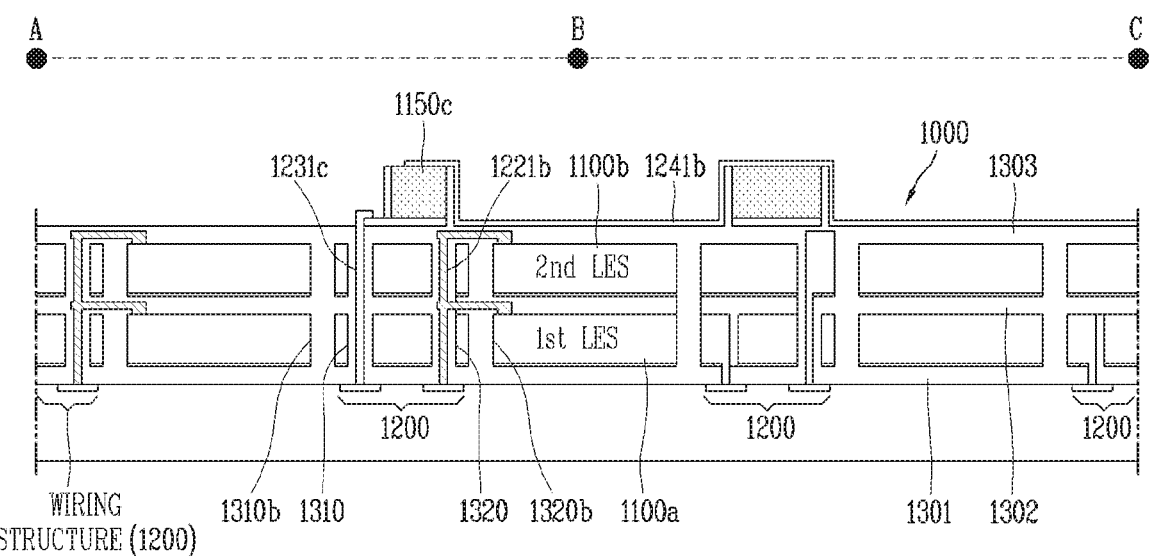
FIGS. 8A and 8B are a sectional view and a front view, respectively, illustrating light emitting structures and a wiring structure of a display device according to an embodiment.
Figure 8B:
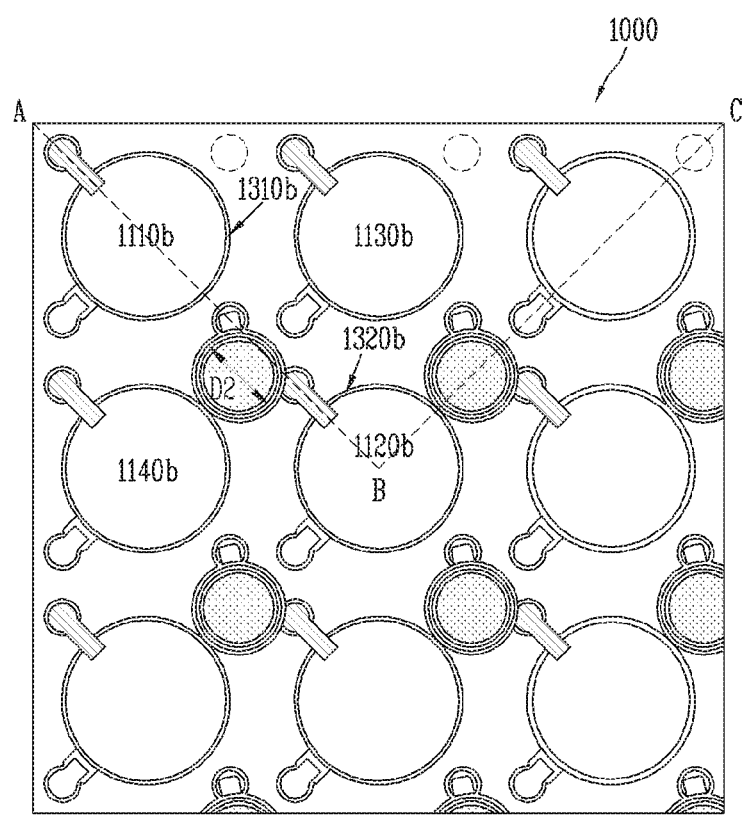

Meanwhile, in a display device having a light emitting structure according to the present disclosure, a vertical chip structure can be formed to have a smaller size, which can result in maintaining a lower interference level between different light emitting structures. In this regard, FIGS. 8A and 8B are a sectional view and a front view, respectively, illustrating light emitting structures and a wiring structure of a display device according to an embodiment. The structure in which the light emitting structures of FIG. 8A are stacked is shown in a sectional view taken along a line AB in one axial direction and a line BC perpendicular to the one axial direction in the front view of FIG. 8B.

Referring to FIGS. 8A and 8B, a display device 1000 having a light emitting structure can include first light emitting structures 1100*a*, second light emitting structures 1100*b*, and light emitting elements 1150*c*. The first light emitting structures 1100*a* can be stacked on a first insulating layer 1301 on a driving panel 1400. The second light emitting structures 1100*b* can be stacked on a second insulating layer 1302 on top of the first light emitting structure 1100*a*. The second light emitting structures 1100*b* can be stacked in alignment with the first light emitting structures 1100*a*. The first light emitting structures 1100*a*, the second light emitting structures 1100*b*, and the light emitting elements 1150*c* can constitute a first layer, a second layer, and a third layer, respectively. First Polarity, second polarity The light emitting element 1150*c* can be disposed in an offset structure to be spaced apart from centers of the first and second light emitting structures 1100*a* and 1100*b*. The light emitting element 1150*c* can be disposed in an offset structure to be spaced apart from centers of the first and second light emitting structures 1100*a* and 1100*b*. The light emitting element 1150*c* can be implemented as a second chip having a second diameter shorter than the first diameter.

The second chip 1150*c* disposed on the third layer can be disposed between the first and second light emitting elements 1110*b* and 1120*b*, which are two of the second light emitting structures disposed in the one axial direction. A p-electrode 1231*c* connected to a metal layer extending from a lower part (bottom) of the second chip 1150*c* can penetrate an insulating structure 1310 to be connected to one of p-electrodes of the driving panel 1400. The insulating structure 1310 can be spaced apart from an insulating layer 1310*b* surrounding the first light emitting element 1110*b*, and the p-electrode 1231*c* can penetrate the insulating structure 1310.

An n-common electrode 1241*b* connected to an upper region of the second chip 1150*c* can be stacked on one side region of the second chip 1231. The n-common electrode 1241*b* can be stacked on an upper region of a third insulating layer 1303 formed in a region between the second chips 1150*c*. An n-electrode of the first light emitting structure 1100*a* and an n-electrode of the second light emitting structure 1100*b* can be connected to a wiring structure penetrating a second insulating structure 1320 to form an n-common electrode 1221*b*.

The second insulating structure 1320 can be spaced apart from an insulating layer 1320*b* surrounding the second light emitting element 1120*b* and the n-common electrode 1221*b* can be formed in the second insulating structure 1320. The second chip 1150*c* need not be connected to the n-common electrode 1221*b* but can be connected to the n-common electrode 1241*b* formed on the upper region and the one side region. Therefore, the n-common electrode 1221*b* of the first light emitting structure 1100*a* and the second light emitting structure 1100*b* can be formed in a structure that is spaced apart from the n-common electrode 1241*b* of the upper region of the second chip 1150*c*.

Figure 9A:
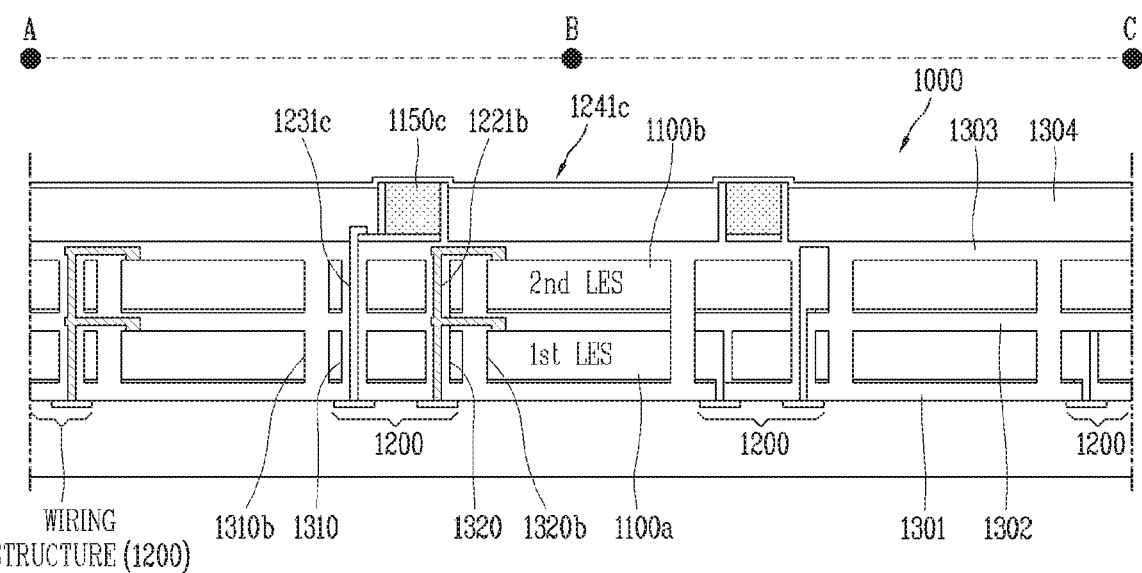
FIGS. 9A and 9B are a sectional view and a front view, respectively, illustrating light emitting structures and a wiring structure of a display device according to the present disclosure.
Figure 9B:
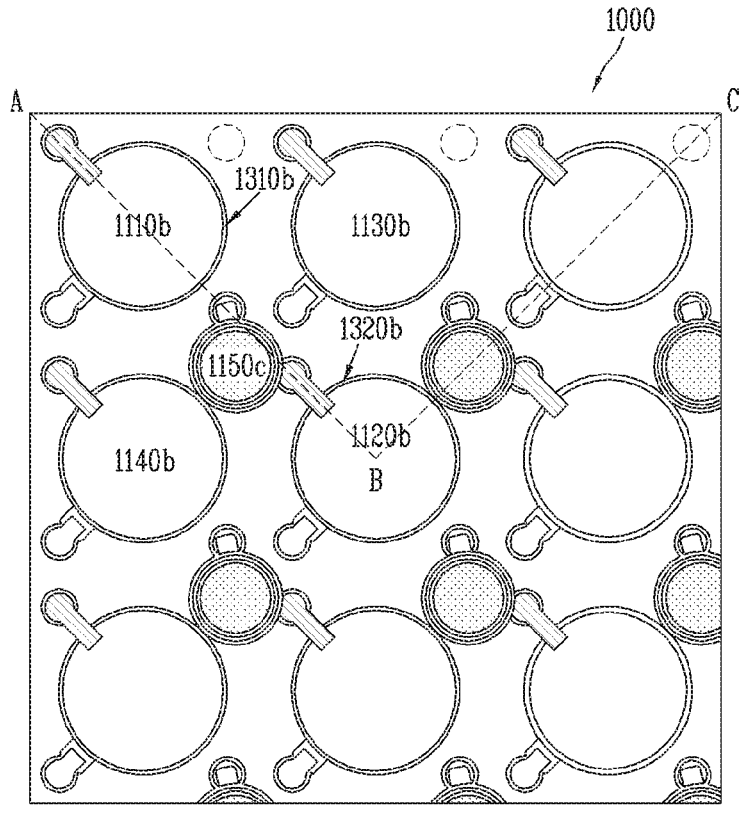

On the other hand, in a display device having a light emitting structure according to the present disclosure, an n-common electrode can be formed only on an upper region of a vertical chip structure. In this regard, FIGS. 9A and 9B are a sectional view and a front view, respectively, illustrating light emitting structures and a wiring structure of a display device according to an embodiment. The structure in which the light emitting structures of FIG. 9A are stacked is shown in a sectional view taken along a line AB in one axial direction and a line BC perpendicular to the one axial direction in the front view of FIG. 9B.

Referring to FIGS. 9A and 9B, a display device 1000 having a light emitting structure can include first light emitting structures 1100*a*, second light emitting structures 1100*b*, and light emitting elements 1150*c*. The first light emitting structures 1100*a* can be stacked on a first insulating layer 1301 on a driving panel 1400. The second light emitting structures 1100*b* can be stacked on a second insulating layer 1302 on top of the first light emitting structure 1100*a*. The second light emitting structures 1100*b* can be stacked in alignment with the first light emitting structures 1100*a*. The first light emitting structures 1100*a*, the second light emitting structures 1100*b*, and the light emitting elements 1150*c* can constitute a first layer, a second layer, and a third layer, respectively.

The light emitting element 1150*c* can be disposed in an offset structure to be spaced apart from centers of the first and second light emitting structures 1100*a* and 1100*b*. The light emitting element 1150*c* can be disposed in an offset structure to be spaced apart from centers of the first and second light emitting structures 1100*a* and 1100*b*. The light emitting element 1150*c* can be implemented as a second chip having a second diameter short than the first diameter.

The second chip 1150*c* disposed on the third layer can be disposed between first and second light emitting elements 1110*b* and 1120*b*, which are two of the second light emitting structures disposed in the one axial direction. The p-electrode 1231*c* connected to a metal layer extending from a lower part (bottom) of the second chip 1150*c* can penetrate an insulating structure 1310 to be connected to one of p-electrodes of the driving panel 1400. The insulating structure 1310 can be spaced apart from an insulating layer 1310*b* surrounding the first light emitting element 1110*b*, and the p-electrode 1231*c* can penetrate the insulating structure 1310.

An n-common electrode 1241*c* connected to an upper region of the second chip 1150*c* can be stacked on an upper region of the second chip 1150*c* and an upper region of a fourth insulating layer 1304 disposed on top of the third insulating layer 1303. An n-electrode of the first light emitting structure 1100*a* and an n-electrode of the second light emitting structure 1100*b* can be connected to a wiring structure penetrating a second insulating structure 1320 to form an n-common electrode 1221*b*.

The second insulating structure 1320 can be spaced apart from an insulating layer 1320*b* surrounding the second light emitting element 1120*b* and the n-common electrode 1221*b* can be formed in the second insulating structure 1320. The second chip 1150*c* need not be connected to the n-common electrode 1221*b* but can be connected to the n-common electrode 1241*c* formed on the upper region and the one side region. Therefore, the n-common electrode 1221*b* of the first light emitting structure 1100*a* and the second light emitting structure 1100*b* can be formed in a structure that is spaced apart from the n-common electrode 1241c of the upper region of the second chip 1150c.

Figure 10A:
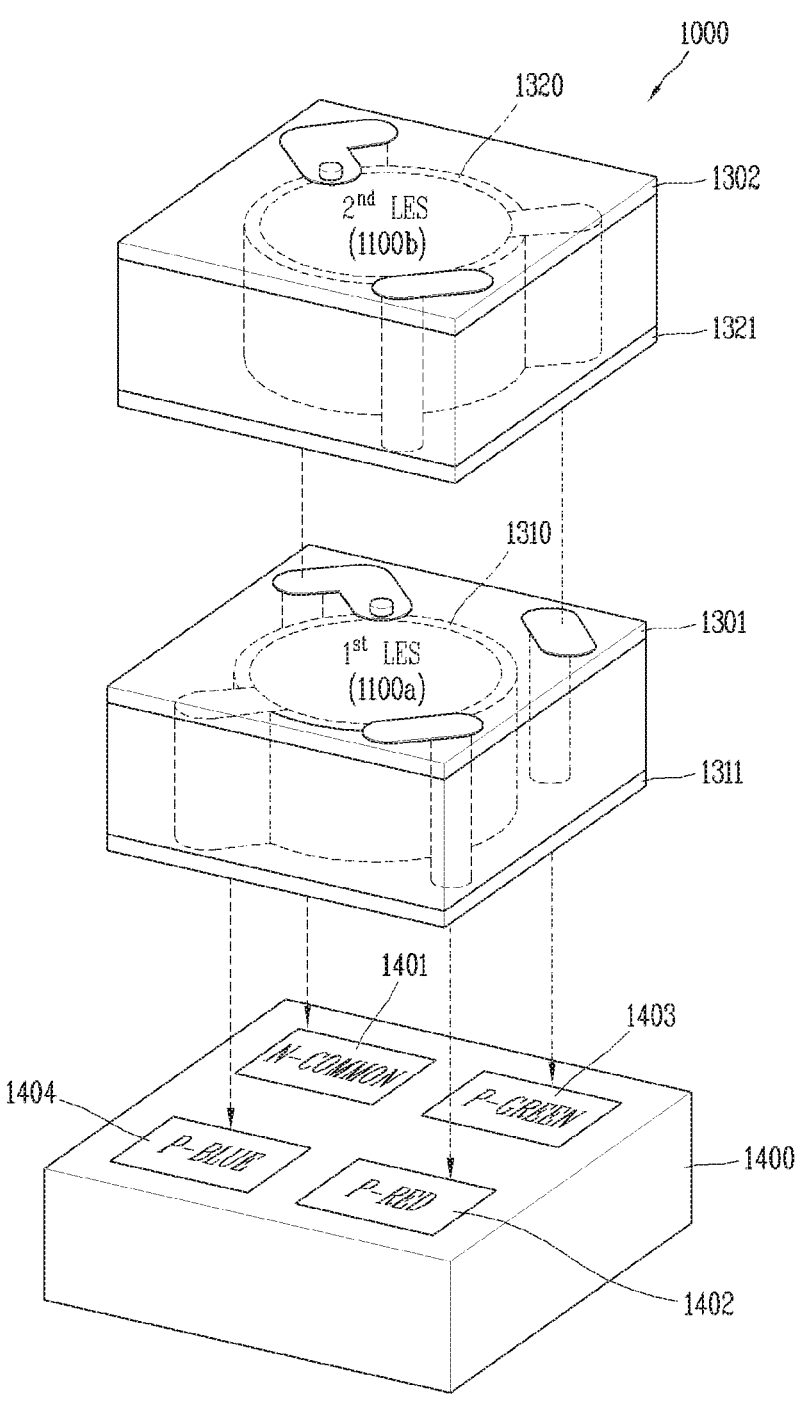
FIGS. 10A to 10C illustrate a wiring structure of a display device having a light emitting structure according to the present disclosure.
Figure 10B:
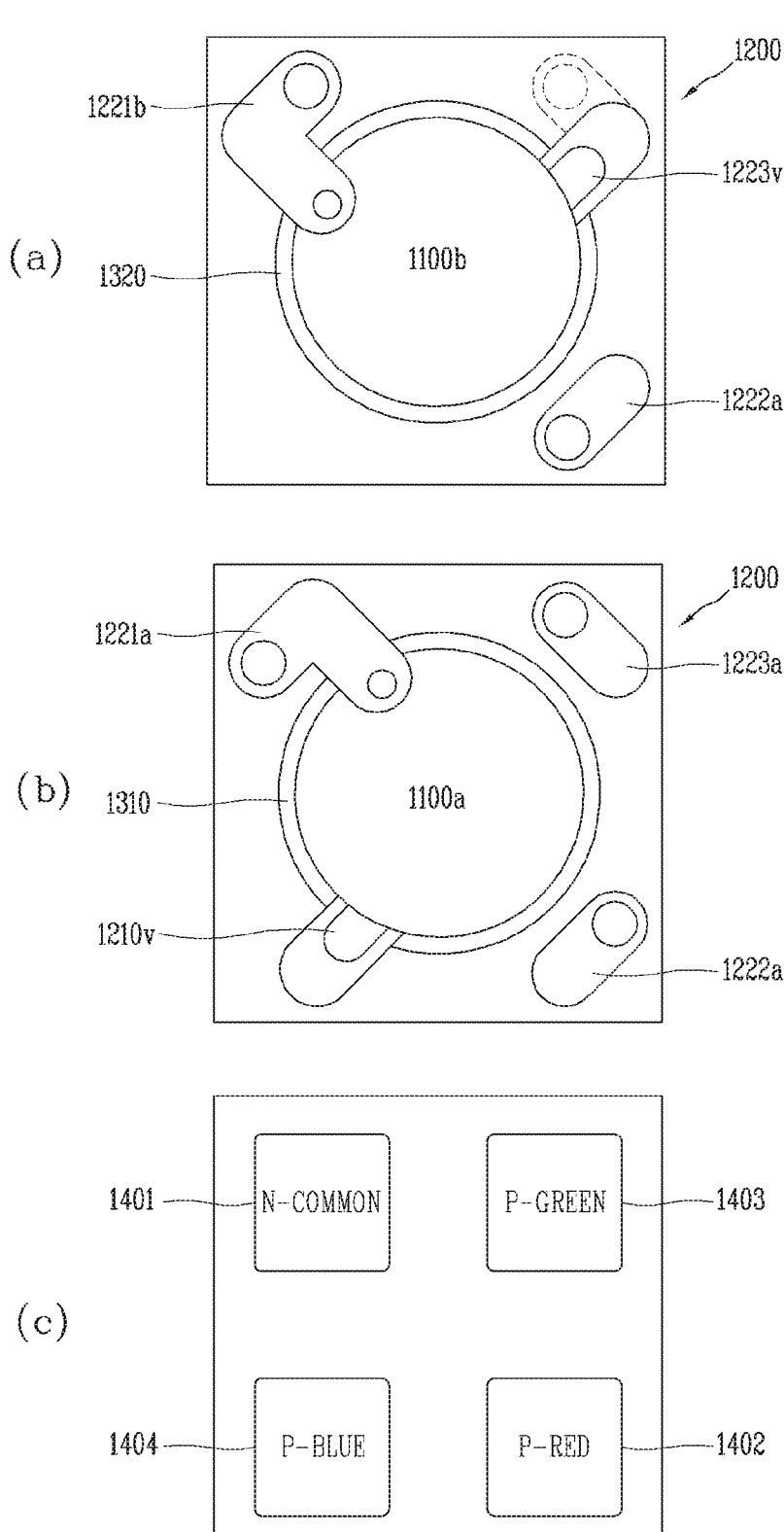
Figure 10C:
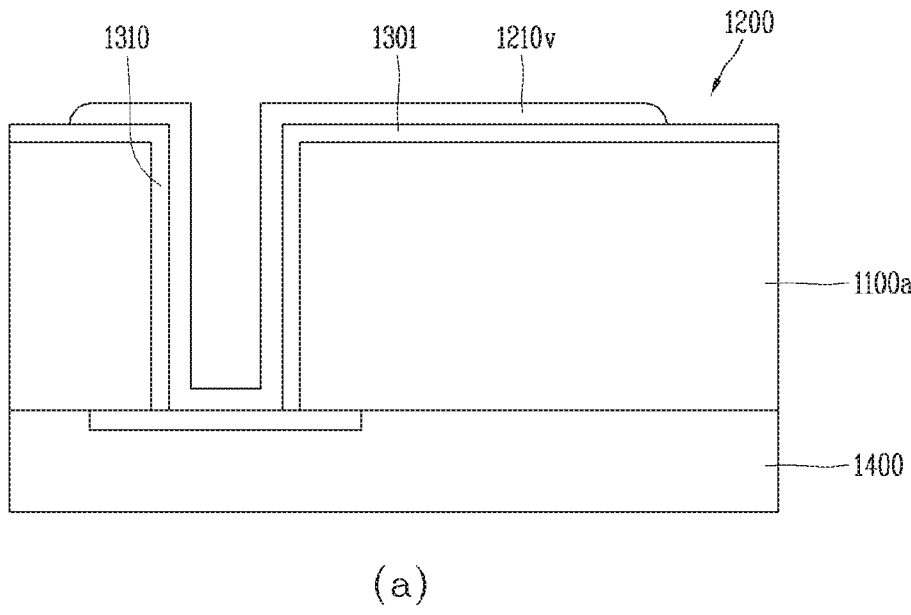
Figure 10C:
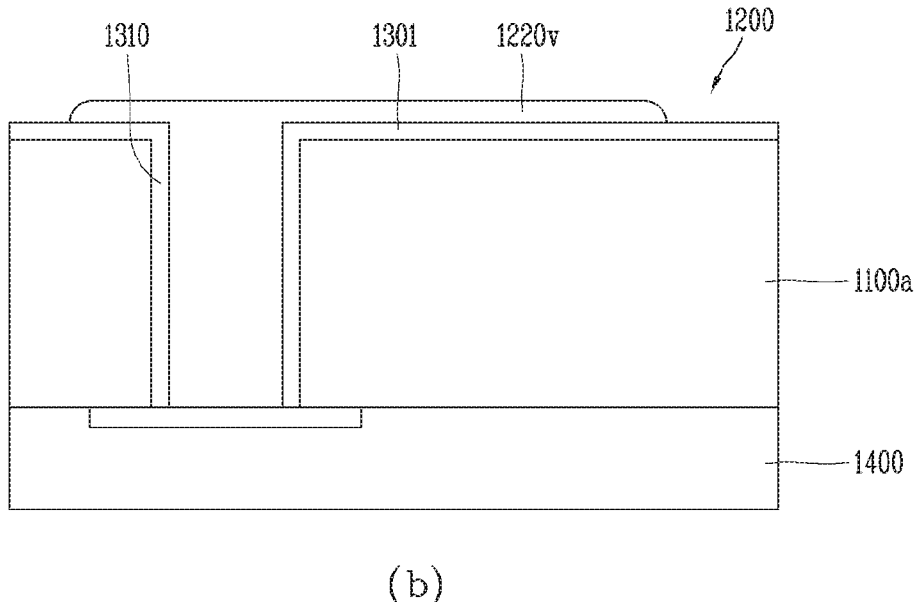

The display devices each having the light emitting structure according to the present disclosure can be configured to be interconnected through a wiring structure. In this regard, FIGS. 10A to 10C illustrate a wiring structure of a display device having a light emitting structure according to the present disclosure. FIG. 10A is an exploded perspective view illustrating first and second light emitting structures disposed on tops of electrodes of a driving panel. FIG. 10B is a front view illustrating the driving panel and the first and second light emitting structures of FIG. 10A. FIG. 10C is a sectional view illustrating that the first light emitting structure is connected to the driving panel through a wiring structure having a via structure.

Referring to FIGS. 10A to 10C, the first light emitting structure 1100a can be configured as a blue-light emitting layer, and the second light emitting structure 1100b can be configured as a green-light emitting layer, but need not be limited thereto. One of the first and second light emitting structures 1100a and 1100b can be configured as a blue-light emitting layer, and the other can be configured as a green-light emitting layer.

The driving panel 1400 can include an n-common electrode 1401, a p-red electrode 1402, a p-green electrode 1403, and a p-blue electrode 1404. An insulating layer 1310 can be formed to surround a side surface of the first light emitting structure 1100a. The insulating layer 1310 can extend to be formed even on a front or rear surface of the first light emitting structure 1100a. An insulating layer 1320 can be formed to surround a side surface of the second light emitting structure 1100b. The insulating layer 1320 can also extend to be formed even on a front or rear surface of the second light emitting structure 1100b.

In this regard, the insulating layers 1310 and 1320 can be formed on side surfaces and front surfaces of the first and second light emitting structures 1100a and 1100b. The insulating layers 1310 and 1320 can be formed on the side surfaces of the first and second light emitting structures 1100a and 1100b. Insulating layers 1301 and 1302 formed on the front surfaces of the first and second light emitting structures 1100a and 1100b can be configured as first and second insulating layers 1301 and 1302, respectively. Insulating layers 1311 and 1321 formed on the rear surfaces of the first and second light emitting structures 1100a and 1100b can be configured as adhesive layers 1311 and 1321, respectively.

The first and second light emitting structures 1100a and 1100b can be formed of GaN, but such need not be limited thereto, and other materials can be used. The insulating layers 1310 and 1320 of the first and second light emitting structures 1100a and 1100b can be made of SiO$_2$, but need not be limited thereto. The adhesive layers 1311 and 1321 can be made of benzocyclobutene (BCB), SiO$_2$, or the like, but need not be limited thereto. Each of the insulating layers 1310 and 1320 can form a via structure 1210v, 1220v such that electrodes of the first to third layers are connected to the electrodes of the driving panel 1400. The via structure 1210v, 1220v can be formed on upper and side surfaces of the insulating layer 1310. The via structures can be conductive metals, but such need not be limited thereto, and other conductive materials such as non-metals can be used. Additionally, the light emitting element 1150 can be AlGaInP based LED, but materials for the light emitting element 1150 need not be limited thereto, and other materials can be used.

The via structure 1210v can be formed on the upper and side surfaces of the insulating layer 1310 in a shape of a hollow hole. The via structure 1220v can be formed on the upper and side surfaces of the insulating layer 1310 in a shape of a solid hole. In this regard, the via structure 1210v, 1220v can be formed such that the electrodes of the first to third layers are connected to the electrodes of the driving panel 1400. Accordingly, the display device 1000 can further include a wiring structure 1200 that is implemented as the via structure 1210v, 1220v on the insulating layer 1310, 1320.

The wiring structure 1200 can include the insulating layers 1301, 1302, 1310, and 1320 formed on the front (or rear) and side surfaces so that the first light emitting structure 1100a and the second light emitting structure 1100b are connected to the electrodes of the driving panel 1400. FIG. 10C illustrates the via structure 1210v, 1220v formed on the first light emitting structure 1100a and the insulating layers 1301 and 1310 of the side and front surfaces. However, the structure need not be limited thereto, and the via structure 1210v, 1220v of FIG. 10C can be formed on the second light emitting structure 1100b and the insulating layers 1302 and 1320 of the side and front surfaces of FIG. 10A.

Referring to FIGS. 10A to 10C, the wiring structure 1200 of the first layer can include first and second wiring structures 1221a and 1222a disposed in one axial direction of the first light emitting structure 1100a. The wiring structure 1200 of the first layer can include a third wiring structure 1223a and the via structure 1210v, 1220v disposed in another axial direction. The first to third wiring structures 1221a to 1223a can form first to third upper electrodes of the first light emitting structure 1100a.

The wiring structure 1200 of the second layer can include first and second wiring structures 1221b and 1222b disposed in one axial direction of the second light emitting structure 1100b. The wiring structure 1200 of the second layer can include a via structure 1223v disposed in another axial direction. The first and second wiring structures 1221b and 1222b can form first and second upper electrodes of the second light emitting structure 1100b.

Figure 11A:
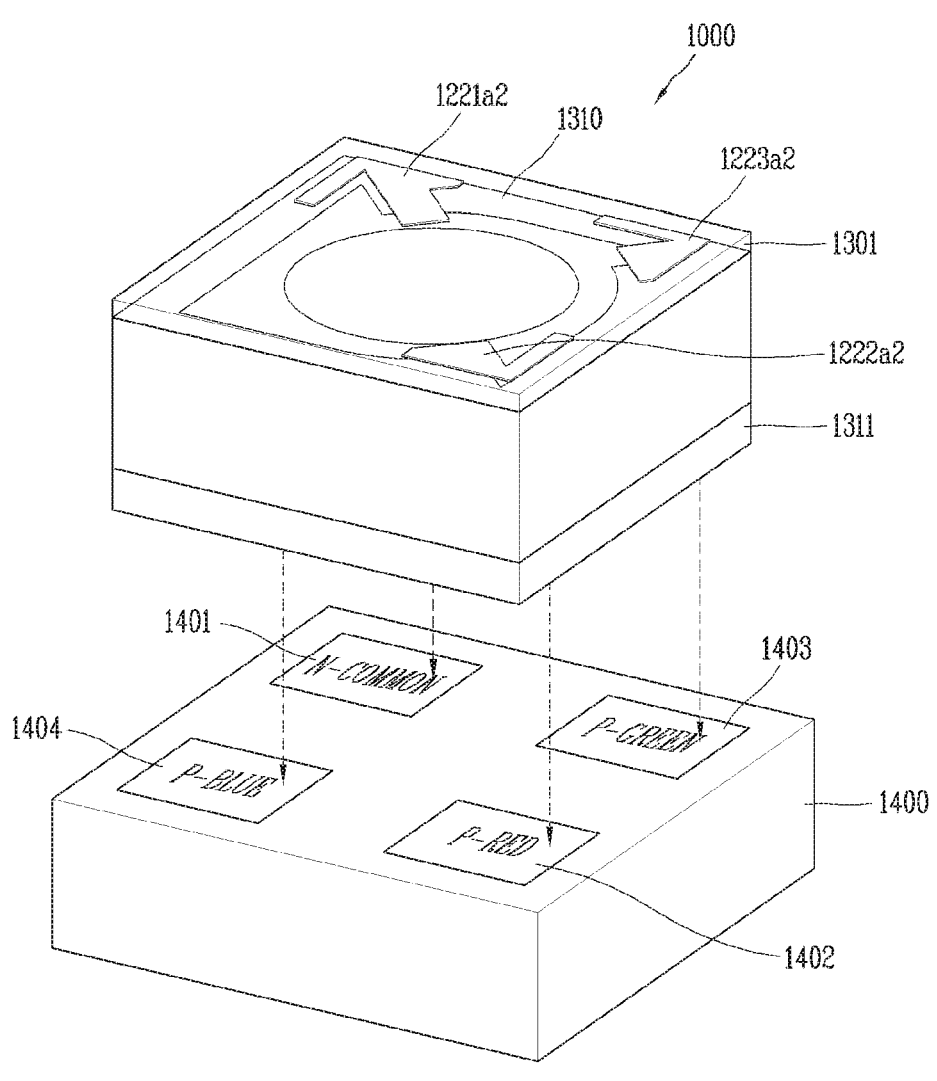
FIGS. 11A to 11C illustrate a wiring structure of a display device having a light emitting structure according to an embodiment.
Figure 11B:
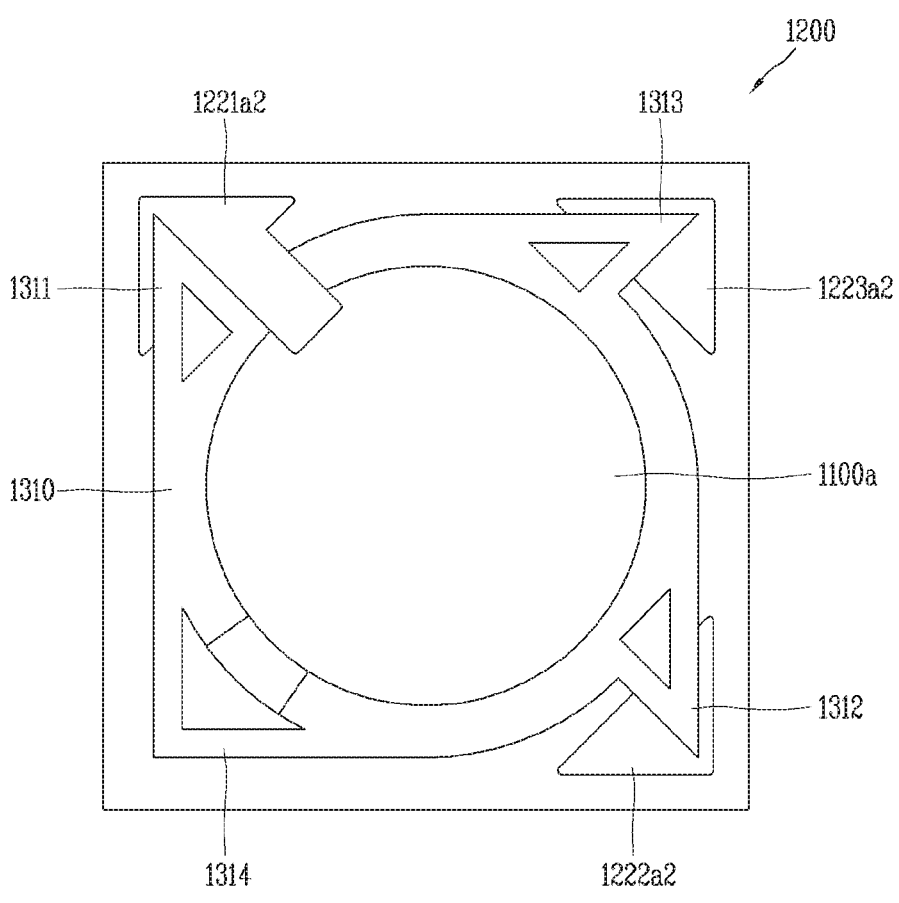
Figure 11C:
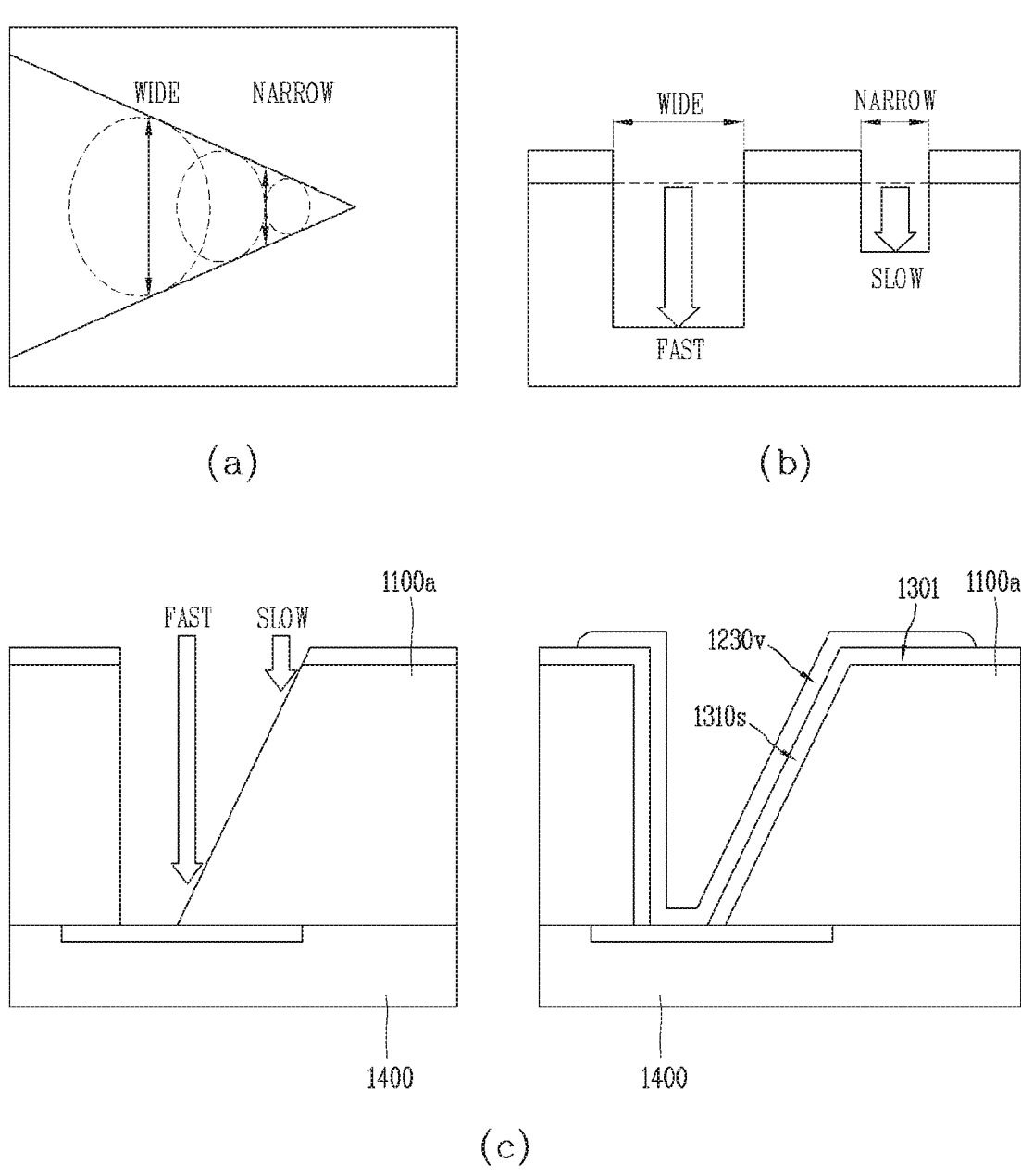

Meanwhile, a wiring structure of a display device having a light emitting structure according to the present disclosure can be configured as a via structure of an inclined (slanted) side (referred to as an inclined side via structure). In this regard, FIGS. 11A to 11C illustrate a wiring structure of a display device having a light emitting structure according to an embodiment. FIG. 11A is an exploded perspective view illustrating a first light emitting structure disposed on top of electrodes of a driving panel. FIG. 11B is a front view illustrating a first light emitting structure having an inclined side via structure of FIG. 11A. FIG. 11C is a sectional view illustrating that the first light emitting structure of FIG. 11B is connected to the driving panel through a wiring structure having the inclined side via structure.

Referring to FIG. 11A, the driving panel 1400 can include an n-common electrode 1401, a p-red electrode 1402, a p-green electrode 1403, and a p-blue electrode 1404. An insulating layer 1310 can be formed to surround a side surface of the first light emitting structure 1100a. The insulating layer 1310 can extend to be formed even on a front or rear surface of the first light emitting structure 1100a. Referring to FIG. 11B, a boundary region of the insulating layer 1310 can include extension regions 1311, 1312, 1313, and 1314 extending from a circular shape to a rectangular shape. The wiring structure 1200 of the first layer can include first and second wiring structures 1221a2 and 1222a2 disposed in one axial direction of the first light emitting structure 1100a. The wiring structure 1200 of the first layer can include a third wiring structure 1223a2 disposed in another axis direction.

Referring to FIG. 11C, as an etching rate becomes faster, an area of a cross-section from which the insulating layer 1310 is removed can be wider. Accordingly, an insulating layer 1310s of a side region having an inclined side structure can be formed according to a difference in etching rate. A via structure 1230v formed on the insulating layer 1310 having the inclined side structure can also be disposed on the insulating layer 1301 of an upper region and the insulating layer 1310s of a side region to be formed in an inclined side via structure 1230v.

Referring to FIGS. 11A to 11C, a boundary region of the insulating layer 1310 disposed on the front surface of the first light emitting structure 1100a can include extension regions 1311, 1312, 1313, and 1314 extending from a circular shape to a rectangular shape. The insulating layer 1310 can form the inclined side via structure 1230v to have a narrower diameter in a downward direction. The via structure 1230v can be disposed on the upper region and the side region of the insulating layer 1310 to form the via structure 1230v with the inclined side. Electrodes of the first to third layers can be connected to the electrodes of the driving panel 1400 through the extension regions 1311, 1312, 1313, and 1314 of the insulating layer 1310.

Meanwhile, the display device having the light emitting structure according to the present disclosure can include a wiring structure, a light reflection layer, and a wavelength selective reflection layer. In addition, the display device having the light emitting structure according to the present disclosure can further include a light reflection structure. In this regard, FIGS. 12 and 13 are sectional views illustrating a display device including a wiring structure, a light reflection layer, and a wavelength selective reflection layer according to embodiments.

Figure 12:
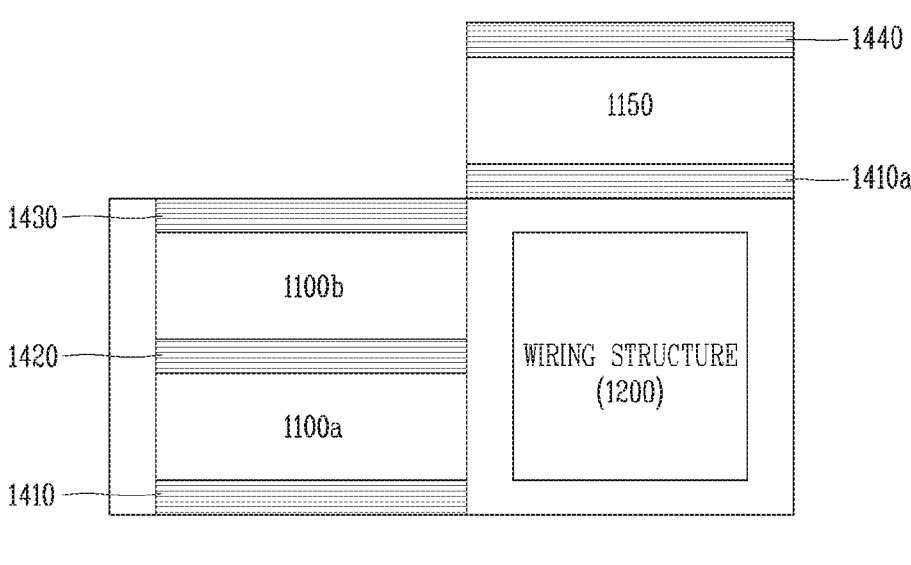
FIGS. 12 and 13 are sectional views illustrating a display device including a wiring structure, a light reflection layer, and a wavelength selective reflection layer according to embodiments.
Figure 12:
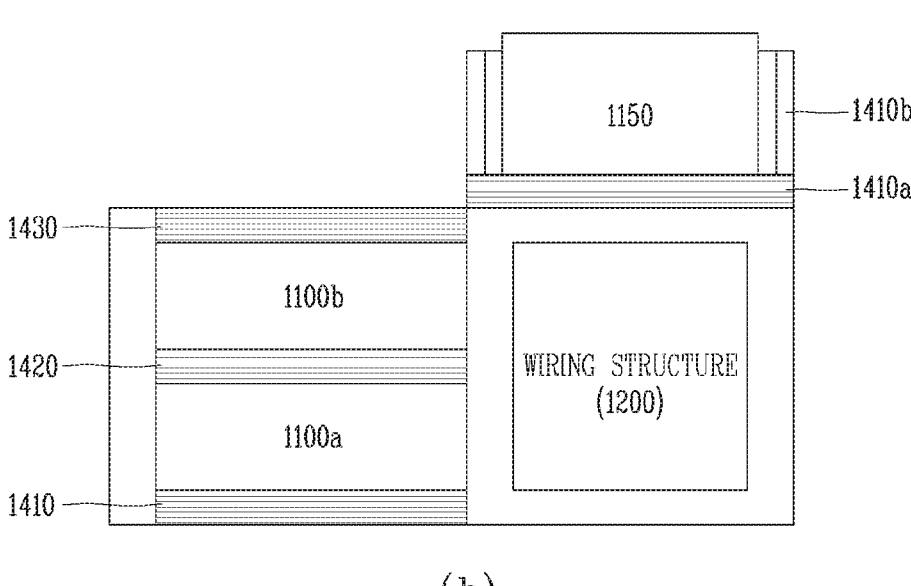
Figure 13:
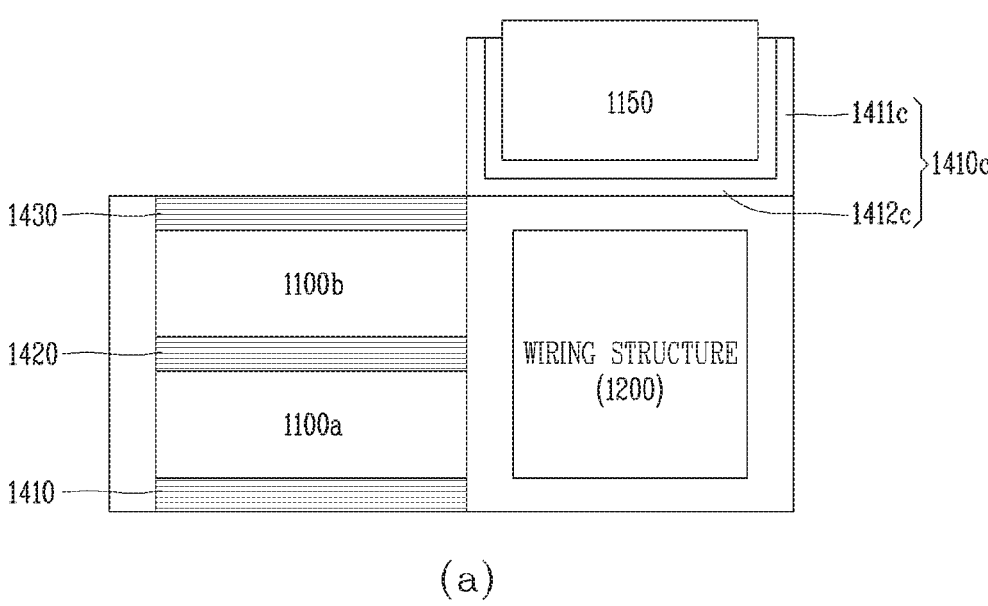
Figure 13:
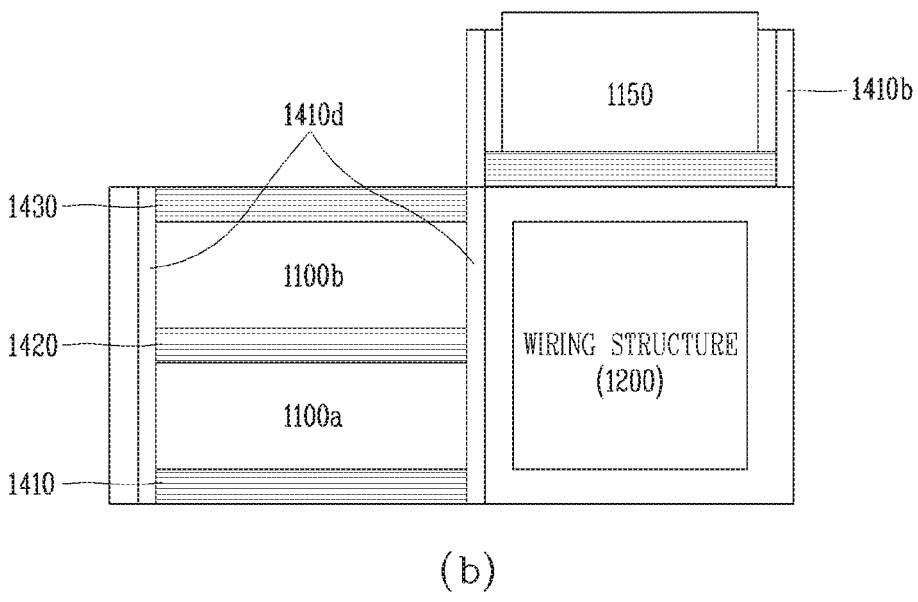

Referring to (a) of FIG. 12 to (b) of FIG. 13, the display device can include a first light emitting structure 1100a, a second light emitting structure 1100b, a light emitting element 1150, and a wiring structure 1200. One of the first and second light emitting structures 1100a and 1100b can be configured as a blue-light emitting layer and the other can be configured as a green-light emitting layer. The light emitting element 1150 can be configured as a red-light emitting element, and the wiring structure 1200 can be disposed on side surfaces of the first light emitting structure 1100a and the second light emitting structure 1100b. The wiring structure 1200 can be disposed on a lower region of the light emitting device 1150.

Referring to (a) of FIG. 12 to (b) of FIG. 13, the display device can further include a light reflection layer 1410 and a wavelength selective reflection layer 1420, 1430. The light reflection layer 1410 can be disposed under the first light emitting structure 1100a. The wavelength selective reflection layer 1420, 1430 can be disposed between the first light emitting structure 1100a and the second light emitting structure 1100b and/or can be disposed on top of the second light emitting structure 1100b.

In this regard, the wavelength selective reflection layer 1420 can be disposed between the first light emitting structure 1100a and the second light emitting structure 1100b. The wavelength selective reflection layer 1430 can be disposed on the top of the second light emitting structure 1100b. A third light emitting structure 1120 can be disposed on top of the wiring structure 1200. The third light emitting structure 1120 can be configured as a light emitting element spaced apart from the first light emitting structure 1100a and the second light emitting structure 1100b. In the structure of (a) of FIG. 12, a wavelength selection layer 1440 can be further disposed on an upper region of the third light emitting structure 1120.

Compared to the structure of (a) of FIG. 12, the display device of (b) of FIG. 12 can further include a light reflection structure 1410b formed of a metal material on a side region of the third light emitting structure 1120. In the structure of (b) of FIG. 12, the light reflection structure 1410b can be disposed on a side region of the third light emitting structure 1120, and a second light reflection layer 1410a can be disposed on a lower region of the third light emitting structure 1120. Accordingly, in the display device of (b) of FIG. 12, a second light reflection layer 1410a can be disposed between the third light emitting structure 1120 and the wiring structure 1200. The light reflection layer 1410 and the second light reflection layer 1410a can be configured as distributed brag reflectors (DBRs), but need not be limited thereto and can vary depending on applications.

Meanwhile, the display device of (a) of FIG. 13 can further include a light reflection structure 1410c. In this regard, the light reflection structure 1410c can extend down to a lower region of the third light emitting structure 1120. Referring to (a) of FIG. 13, the light reflection structure 1410c can include a side reflection structure 1411c and a lower reflection structure 1412c. The side reflection structure 1411c can be formed on a side region of the third light emitting structure 1120. The lower reflection structure 1412c can be formed on a lower region of the third light emitting structure 1120. In the structure in which the light reflection structure 1410c extends down to the lower region of the third light emitting structure 1120, the second light reflection layer need not be formed.

Compared to the structure of (b) of FIG. 12, the display device of (b) of FIG. 13 can further include a second light reflection structure 1410d formed of a metal material on the side regions of the first light emitting structure 1100a and the second light emitting structure 1100b, but which can be electrically disconnected from the first light emitting structure 1100a and the second light emitting structure 1100b. Accordingly, the display device of (b) of FIG. 13 can further include the light reflection structure 1410c and the second light reflection structure 1410d. In this regard, the light reflection structure 1410c can be formed of the metal material on the side region of the third light emitting structure 1120. The second light reflection layer 1410b can be formed on the lower region of the third light emitting structure 1120. The second light reflection layer 1410b can be disposed between the third light emitting structure 1120 and the wiring structure 1200.

Figure 14:
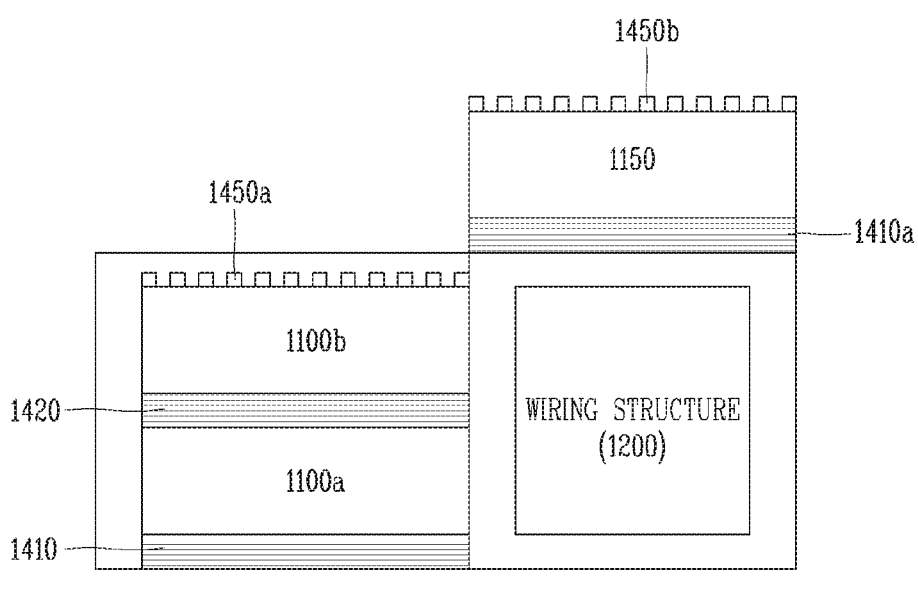
FIGS. 14 and 15 illustrate structures in which light scattering structures are disposed in the structures of FIGS. 12 and 13.
Figure 14:
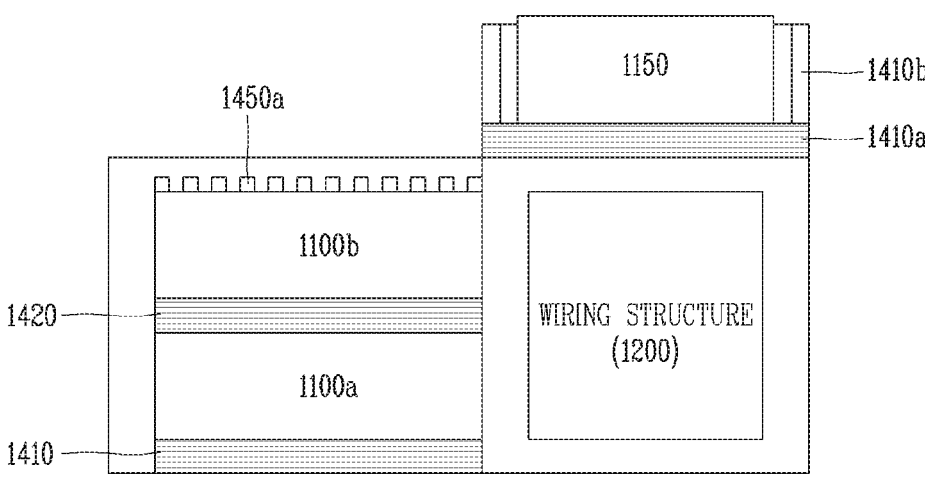
Figure 15:
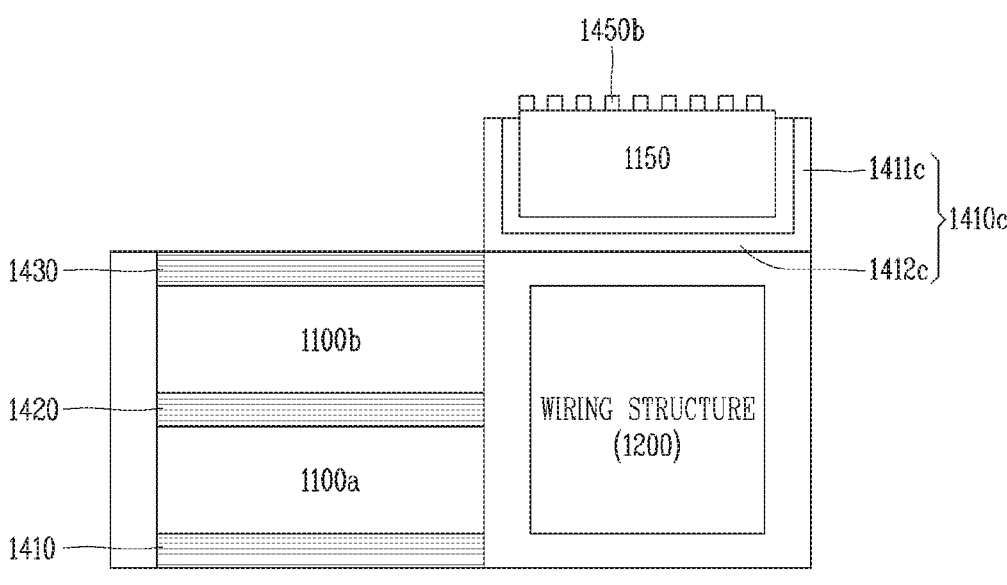
Figure 15:
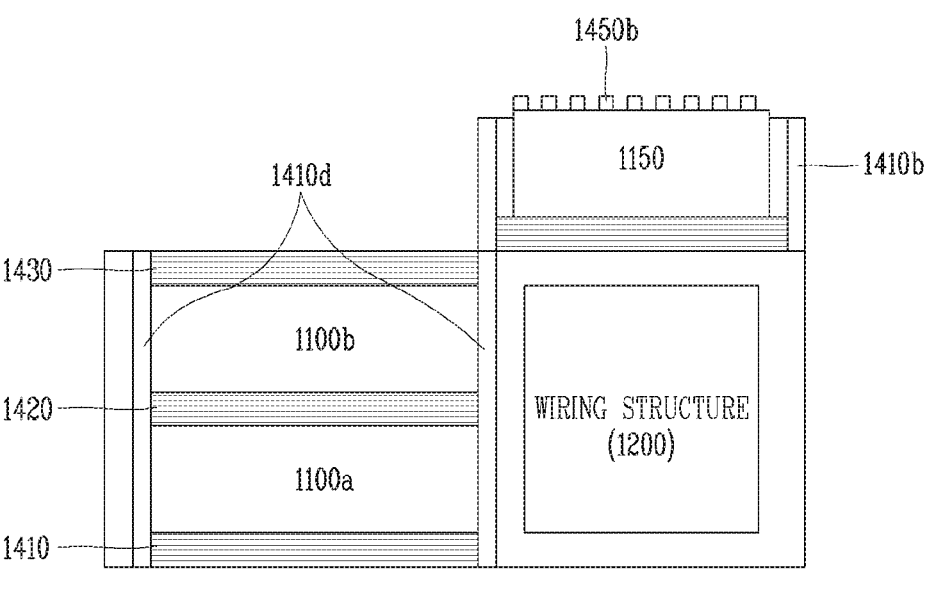

Meanwhile, the display device having the light emitting structure according to the present disclosure can further include a light scattering structure. In this regard, FIGS. 14 and 15 illustrate structures in which light scattering structures are disposed in the structures of FIGS. 12 and 13. The light scattering structures 1450a and 1450b of FIGS. 14 and 15 can have metal patterns formed in predetermined structures. For example, the light scattering structures 1450a and 1450b can be formed of a patterned sapphire substrate (PSS), but need not be limited thereto and can vary depending on applications.

The display device of (a) of FIG. 14 can further include light scattering structures 1450a and 1450b in the display device of (a) of FIG. 12. The display device of (b) of FIG. 14 can further include the light scattering structure 1450a in the display device of (b) of FIG. 12. The display device of (a) of FIG. 15 can further include the light scattering structure 1450b in the display device of (b) of FIG. 13. The display device of (b) of FIG. 15 can further include the light scattering structure 1450*b* in the display device of (b) of FIG. 13.

Compared to the structure of (a) of FIG. 12, in the display device of (a) of FIG. 14, the light scattering structure 1450*a*, 1450*b* can be disposed on top of the second light emitting structure 1100*b* and/or the third light emitting structure 1120. In the display device of (a) of FIG. 14, the light scattering structures 1450*a* and 1450*b* can be formed instead of the wavelength selection reflection layers 1430 and 1440. In this regard, the light scattering structure 1450*a* can be disposed on the top of the second light emitting structure 1100*b*. In addition, the light scattering structure 1450*b* can be formed on the top of the third light emitting structure 1120.

Compared to the structure of (b) of FIG. 12 or (b) of FIG. 13, in the display device of (b) of FIG. 14, the light scattering structure 1450*b* can be disposed on the top of the second light emitting structure 1100*b*. The light scattering structure 1450*a* can be formed in the display device of (b) of FIG. 14, instead of the wavelength selection reflection layer 1430 of the structure of (b) of FIG. 12 or (b) of FIG. 13.

Compared to the structure of (a) of FIG. 13, in the display device of (a) of FIG. 15, the light scattering structure 1450*b* can be disposed on the top of the third light emitting structure 1120. Compared to the structure of (b) of FIG. 13, in the display device of (b) of FIG. 15, the light scattering structure 1450*b* can be disposed on the top of the third light emitting structure 1120. Accordingly, referring to FIGS. 14 and 15, the display device can further include the light scattering structure 1450*a*, 1450*b* disposed on the top of the second light emitting structure 1100*b* and/or the third light emitting structure 1120.

Figure 16A:
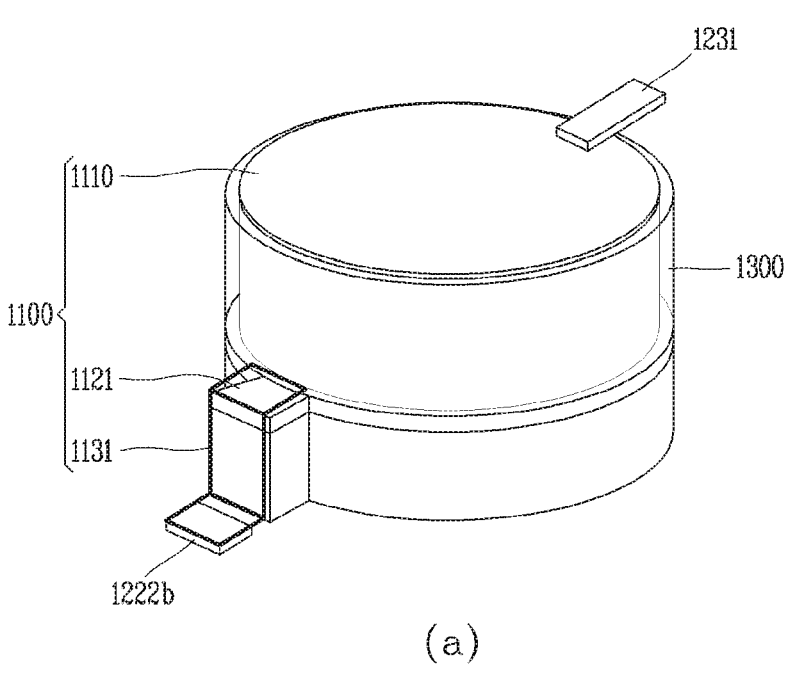
FIGS. 16A to 16C illustrate a unit light emitting structure of a display device according to the present disclosure.
Figure 16A:
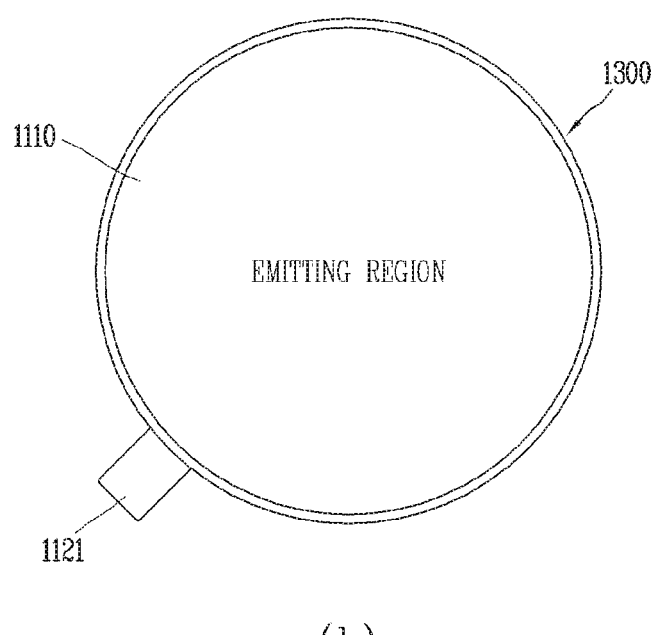
Figure 16B:
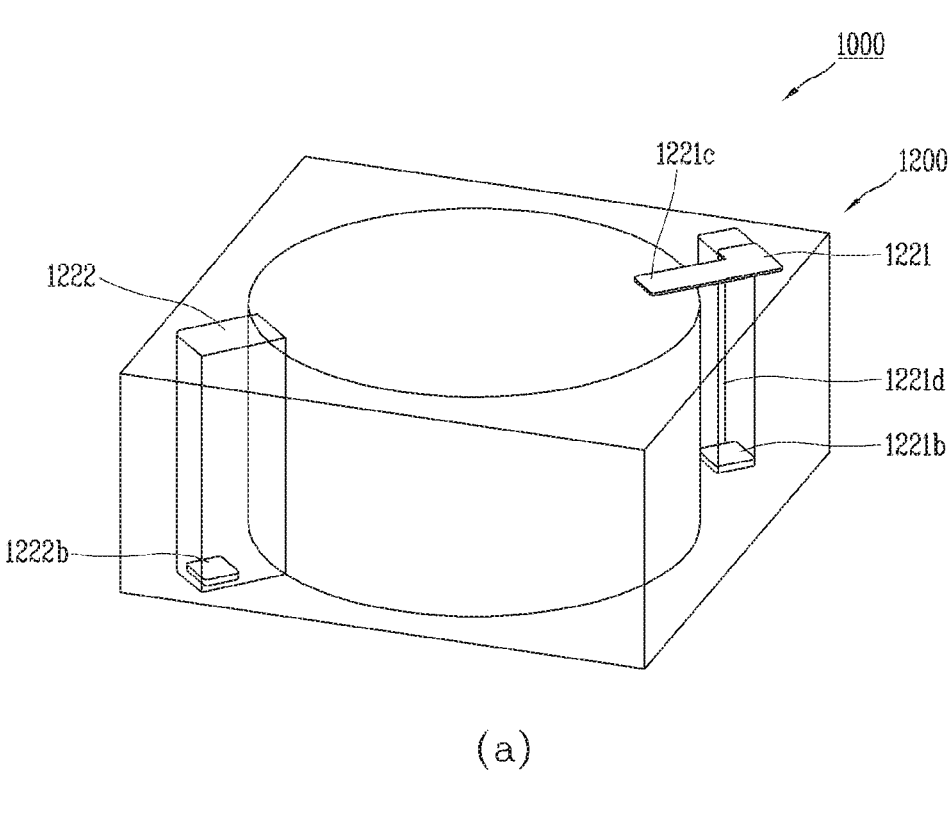
Figure 16B:
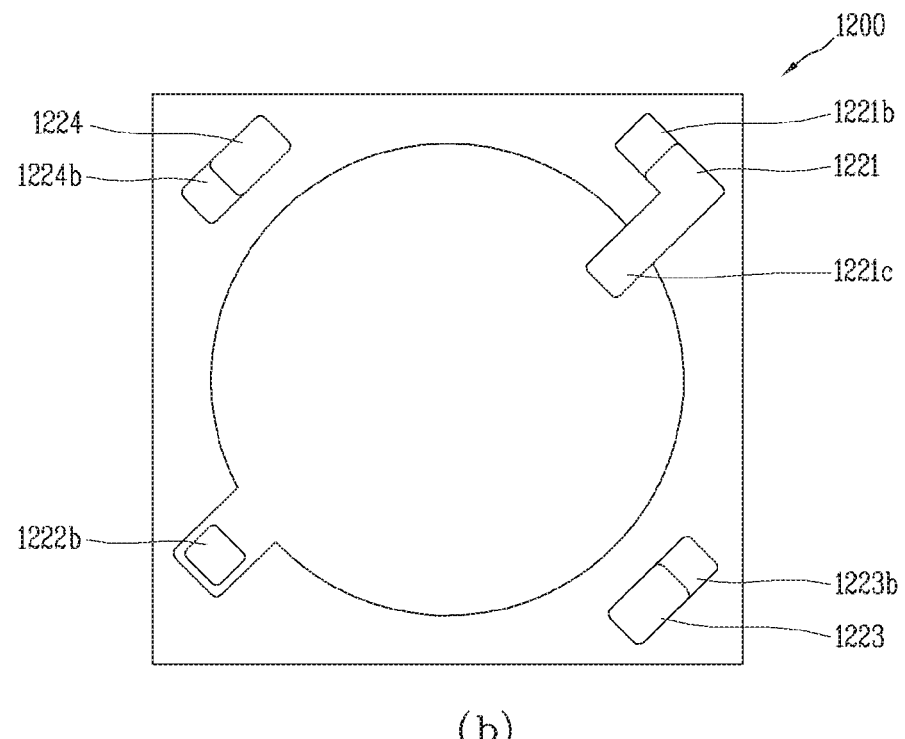
Figure 16C:
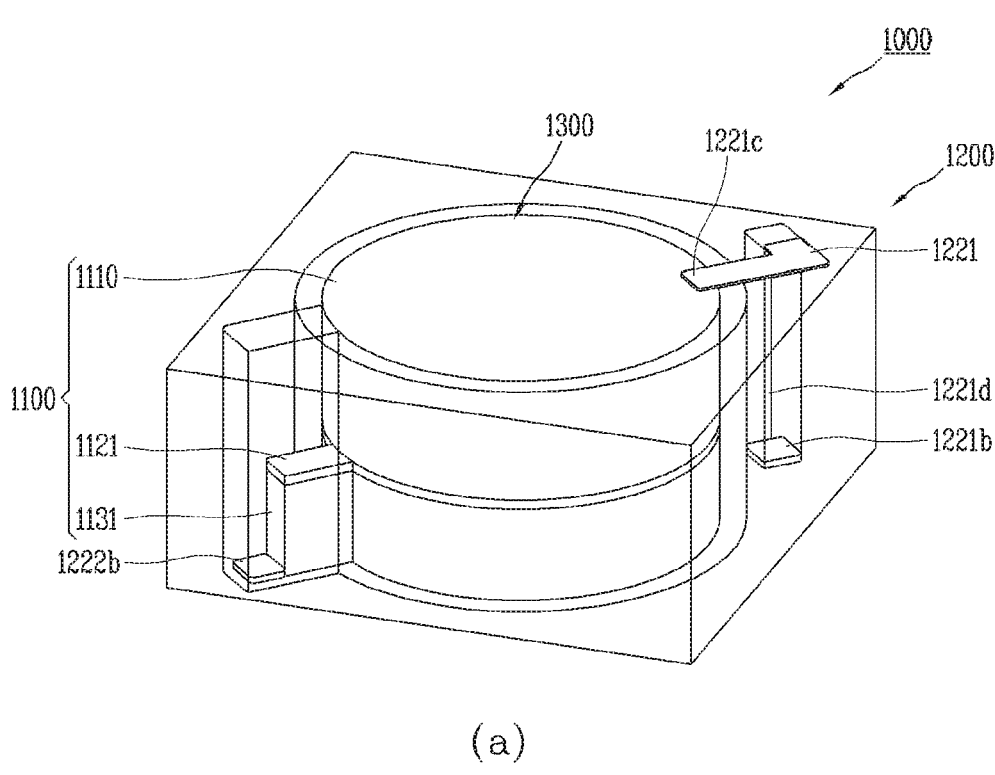
Figure 16C:
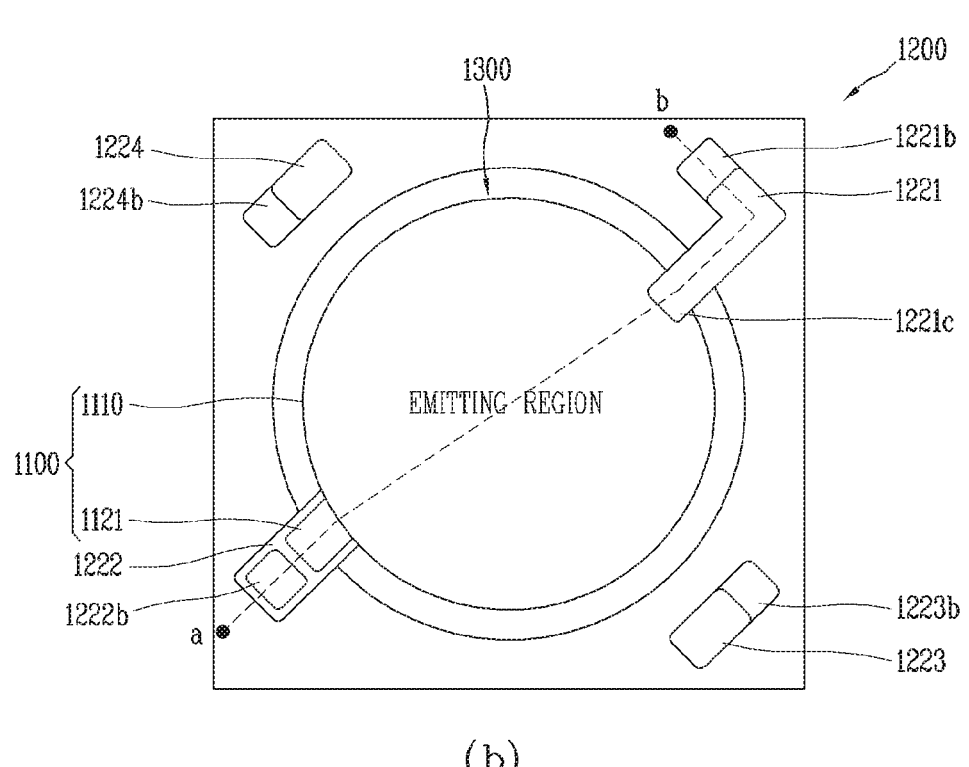

Meanwhile, in the display device according to the present disclosure, a plurality of electrodes can be disposed for each unit element of the stacked driving panel and light emitting structures, to form a layered connection structure. In this regard, FIGS. 16A to 16C illustrate a unit light emitting structure of a display device according to the present disclosure. FIGS. 16A and 16B are a lateral perspective view and a front view, respectively, illustrating light emitting structures and a wiring structure of a display device according to the present disclosure. FIG. 16C is a lateral perspective view and a front view illustrating a unit light emitting layer in which the light emitting structure of FIG. 16A and the wiring structure of FIG. 16B are combined.

Referring to FIGS. 16A to 16C, the display device 1000 can include a light emitting structure 1100 and a wiring structure 1200. The light emitting structure 1100 can include a light emitting body 1110 and a first electrode 1121. The light emitting structure 1100 can include a connection wire 1131 connected to the first electrode 1121. The light emitting body 1110 can be implemented as an LED, OLED, LD, or other light emitting elements. The light emitting elements described above can be configured to emit light based on an application of current through a plurality of electrodes.

The wiring structure 1200 can be coupled to surround a side surface of the light emitting structure 1100. A first upper electrode 1221, a first connection wire 1221*c*, and a first lower electrode 1221*b* of the wiring structure 1200 can form a first wiring structure. A second upper electrode 1222 and a second lower electrode 1222*b* of the wiring structure 1200 can form a second wiring structure. A third upper electrode 1223 and a third lower electrode 1223*b* of the wiring structure 1200 can form a third wiring structure. A fourth upper electrode 1224 and a fourth lower electrode 1224*b* of the wiring structure 1200 can form a fourth wiring structure.

The wiring structure 1200 can include a first upper electrode 1221, a second upper electrode 1222, a third upper electrode 1223, and a fourth upper electrode 1224. The wiring structure 1200 can include a first lower electrode 1221*b*, a second upper electrode 1222*b*, a third upper electrode 1223*b*, and a fourth upper electrode 1224*b*. The wiring structure 1200 can include a first connection wire 1221*c* and a second connection wire 1221*d*.

The electrode 1121 formed on the light emitting structure 1100 can be connected to the second lower electrode 1222*b* of the wiring structure 1200 through a connection wire 1131. The first connection wire 1221*c* can be coupled to the light emitting body 1110 of the light emitting structure 1100. The first upper electrode 1221 connected to the first connection wire 1221*c* can be connected to the second lower electrode 1222*b* through the second connection wire 1221*d*. Meanwhile, the wiring structure 1200 can be formed to surround the side surface of the light emitting structure 1100 to form a unit light emitting layer.

The wiring structure 1200 can include the first upper electrode 1221 that is an n-common electrode and the second upper electrode 1222 that is one of p-electrodes. Correspondingly, the wiring structure 1200 can include the first lower electrode 1221*b* and the second lower electrode 1222*b*. The wiring structure 1200 can include at least one of the third upper electrode 1223 and the fourth upper electrode 1224 which are the remaining p-electrodes. Correspondingly, the wiring structure 1200 can include at least one of the third lower electrode 1223*b* and the fourth lower electrode 1224*b*.

The third lower electrode 1223*b* and the fourth lower electrode 1224*b* can be disposed between the first lower electrode 1221*b* and the second lower electrode 1222*b*. The third lower electrode 1223*b* and the fourth lower electrode 1224*b* can be disposed at positions corresponding to the third upper electrode 1223 and the fourth upper electrode 1224. The first lower electrode 1221*b* can be connected to a cathode of the driving panel. The second lower electrode 1222*b*, the third lower electrode 1223*b*, and the fourth lower electrode 1224*b* can be connected to an anode of the driving panel.

The display device can further include a dielectric structure 1300. The dielectric structure 1300 can be disposed between an outside of the light emitting body 1110 and an inside of the wiring structure 1200. The dielectric structure 1300 can be disposed between the light emitting structure 1100 and the wiring structure 1200 so that the light emitting structure 1100 including the light emitting body 1110 and the wiring structure 1200 are separated from each other.

A unit light emitting layer can include a light emitting structure 1100 corresponding to a core and a wiring structure 1200 corresponding to a shell surrounding the core. The light emitting structure 1100 is a structure for light emission, and can include a light emitting body 1110 and a plurality of electrodes. The wiring structure 1200 is a structure for wiring for injecting charge into the corresponding light emitting structure 1100. The wiring structure 1200 can include an upper electrode, a lower electrode, and a wiring structure (connection wire) connecting each of upper electrode and lower electrode. A dielectric structure 1300 made of a dielectric material can be interposed between the light emitting structure 1100 and the wiring structure 1200. The dielectric structure 1300 can facilitate arrangement of the connection wire between the light emitting structure 1100 and the wiring structure 1200.

Meanwhile, a dielectric material can be used as a bonding structure between a plurality of light emitting bodies, but need not be limited thereto, and can be configured to perform a function, like a distributed brag reflector (DBR), of selectively transmitting or reflecting light of a specific wavelength. An LED, OLED, LD, or other light emitting element can be used as the light emitting body 1110 and the light emitting element can emit light when current is applied through a plurality of electrodes. A surface of the light emitting body 1110 can be covered with a dielectric layer as needed, and the dielectric layer can be implemented as a passivation layer having a passivation function.

Figure 17A:
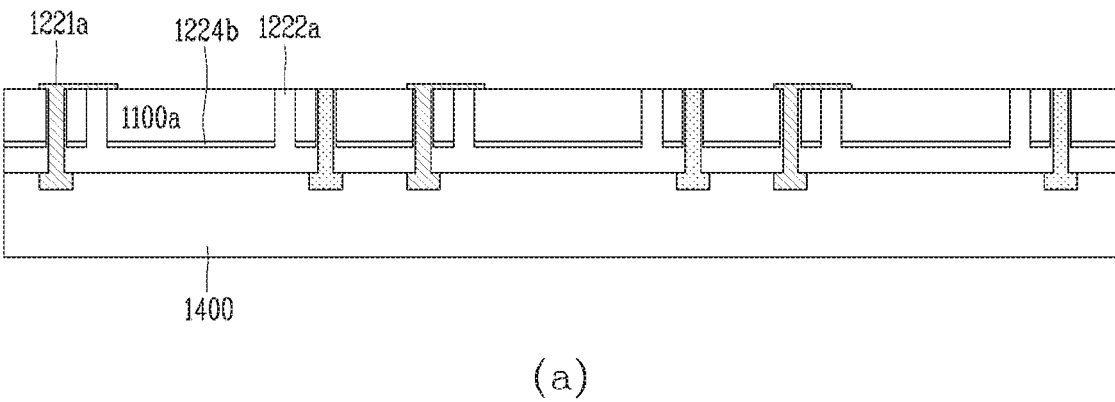
FIGS. 17A and 17B illustrate a structure in which a first layer having first light emitting structures is stacked on top of a driving panel.
Figure 17A:
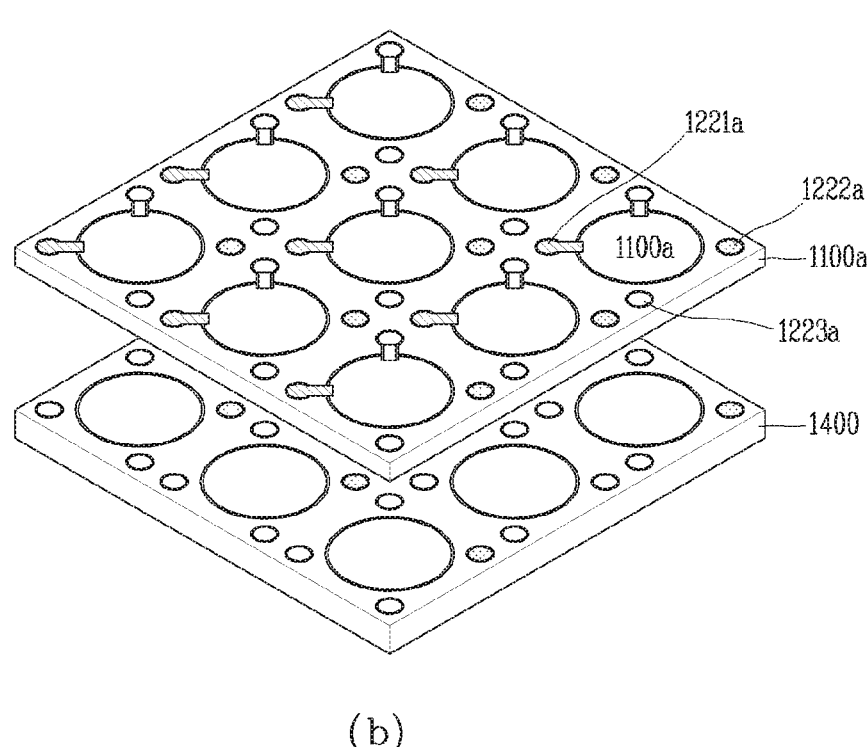
Figure 17B:
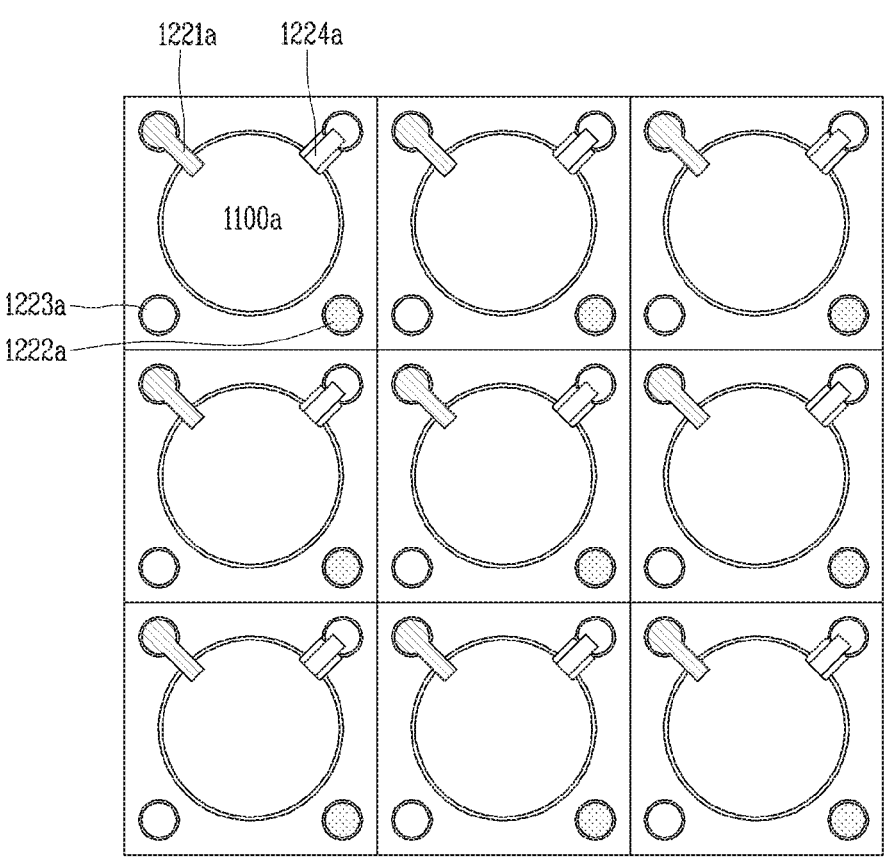

Meanwhile, in the display device according to the present disclosure, a plurality of electrodes can be disposed for each unit element of the stacked driving panel and light emitting structures, to form a layered connection structure. In this regard, FIGS. 17A and 17B illustrate a structure in which a first layer having first light emitting structures is stacked on top of a driving panel. FIG. 17A illustrates sectional and perspective views in which the first layer is disposed on the top of the driving panel. FIG. 17B illustrates a structure in which the first light emitting structures of the first layer are connected to a wiring structure.

Referring to FIGS. 17A and 17B, the first light emitting structures 1100a can be configured as green-light emitting elements. Each wiring structure of the first light emitting structures 1100a can include an n-common electrode 1221a spaced apart from a first insulating layer 1310a, and a first p-electrode 1222a, a second p-electrode 1223a and a third p-electrode 1224a which are red, blue, and green. The n-common electrode 1221a, the first p-electrode 1222a, the second p-electrode 1223a, and the third p-electrode 1224a can be referred to as a first wiring structure, a second wiring structure, a third wiring structure, and a fourth wiring structure, respectively.

In this regard, the wiring structure 1200 of the first layer can include the first and second wiring structures 1221a and 1222a disposed in one axial direction of the first light emitting structure 1100a. The wiring structure 1200 of the first layer can include the third wiring structure 1223a and the fourth wiring structure 1224a disposed in another axial direction. The n-common electrode 1221a can be connected to the top of the first light emitting structure 1100a. The third p-electrode 1224a can be connected to the bottom of the first light emitting structure 1100a.

Figure 18A:
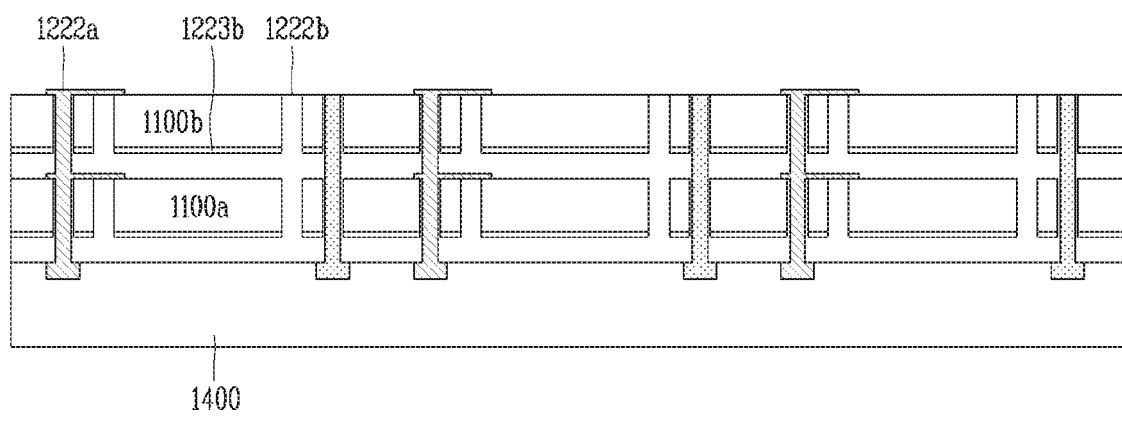
FIGS. 18A and 18B illustrate a structure in which a second layer having second light emitting structures is stacked on the first layer having the first light emitting structures.
Figure 18A:
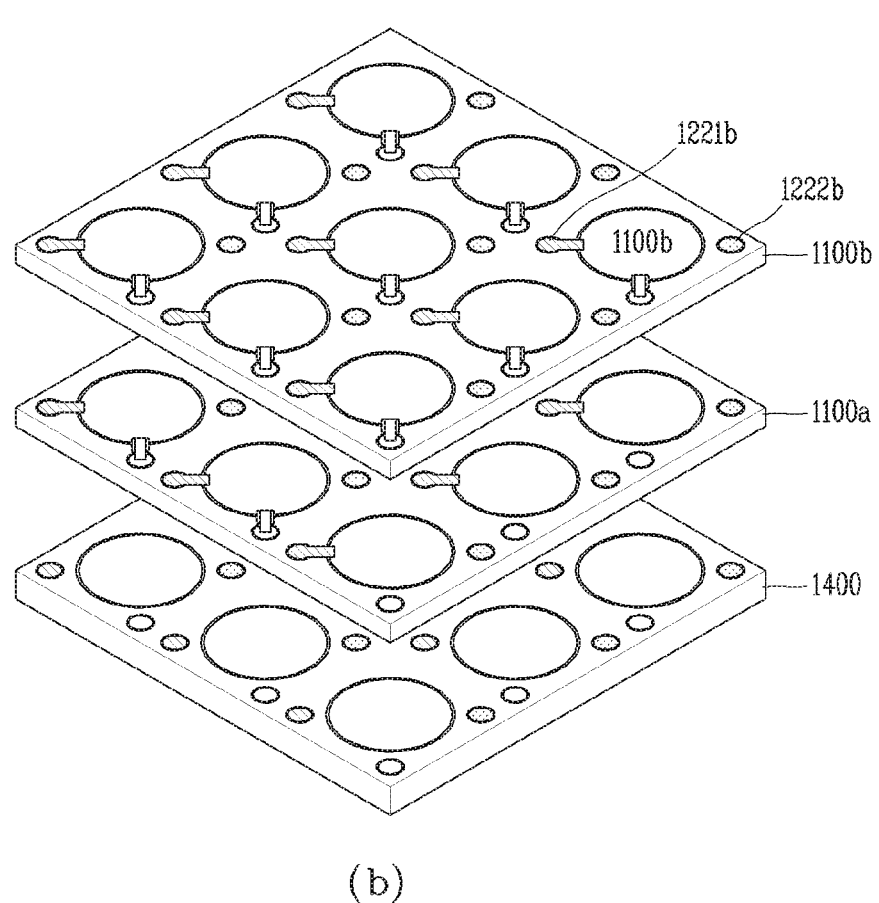
Figure 18B:
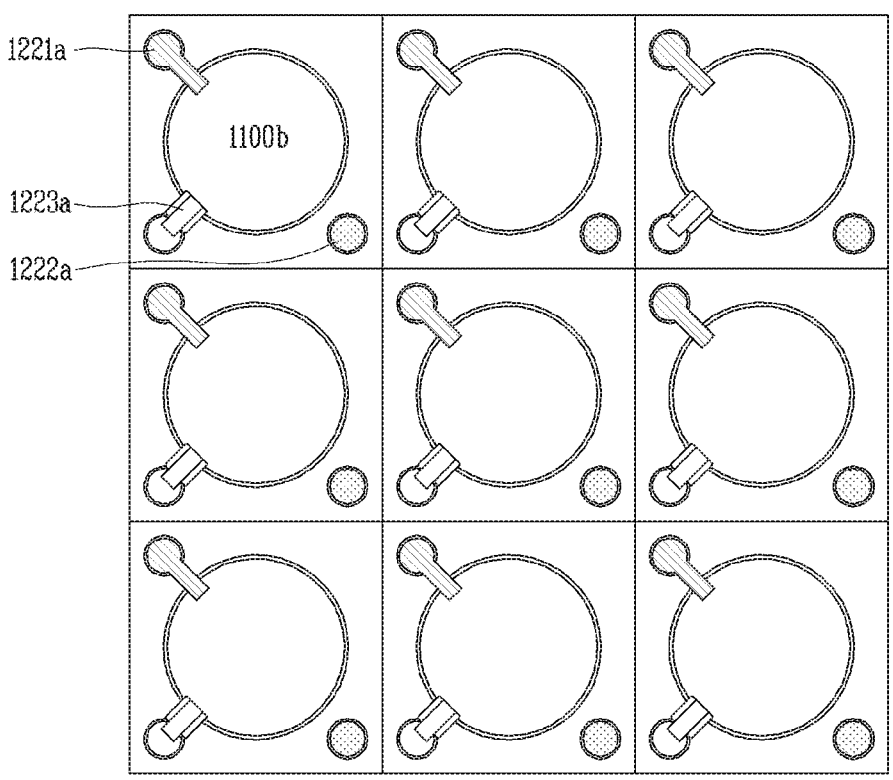

Meanwhile, FIGS. 18A and 18B illustrate a structure in which a second layer having second light emitting structures is stacked on the first layer having the first light emitting structures. FIG. 18A is a sectional and perspective view illustrating that a second layer having second light emitting structures is stacked on the first layer having the first light emitting structures. FIG. 18B illustrates a structure in which the second light emitting structures of the second layer are connected to a wiring structure.

Referring to FIGS. 18A and 18B, the second light emitting structures 1100b can be configured as blue-light emitting elements. Each wiring structure of the first light emitting structures 1100a can include an n-common electrode 1221b spaced apart from a second insulating layer 1310b, a first p-electrode 1222b, and a second p-electrode 1223b which are red and blue. The n-common electrode 1221b, the first p-electrode 1222b, and the second p-electrode 1223b can be referred to as a first wiring structure, a second wiring structure, and a third wiring structure, respectively.

In this regard, the wiring structure 1200 of the second layer can include first and second wiring structures 1221b and 1222b disposed in one axial direction of the second light emitting structure 1100b. The wiring structure 1200 of the second layer can include a third wiring structure 1223b disposed in another axis direction. The n-common electrode 1221b can be connected to the top of the second light emitting structure 1100b. A second p-electrode 1223b can be connected to the bottom of the second light emitting structure 1100b.

Figure 19A:
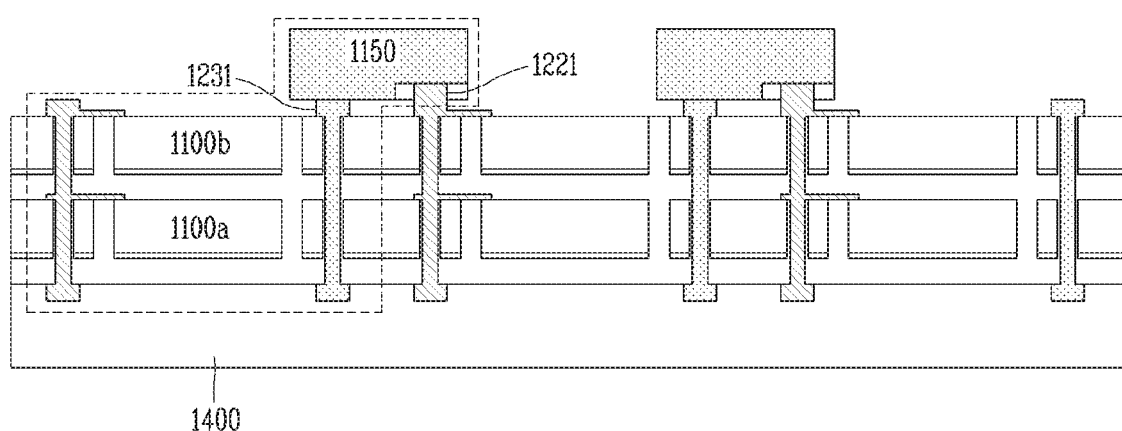
FIGS. 19A and 19B illustrate a structure in which a third layer having chip-type third light emitting structures is stacked on the second layer having the second light emitting structures.
Figure 19A:
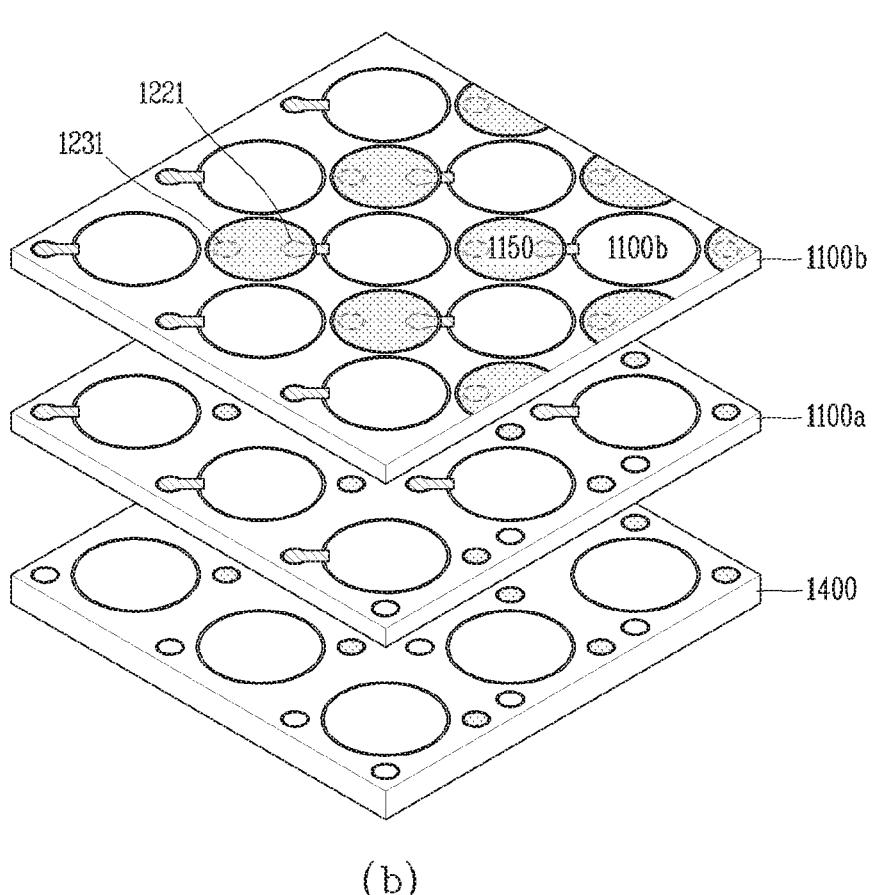
Figure 19B:
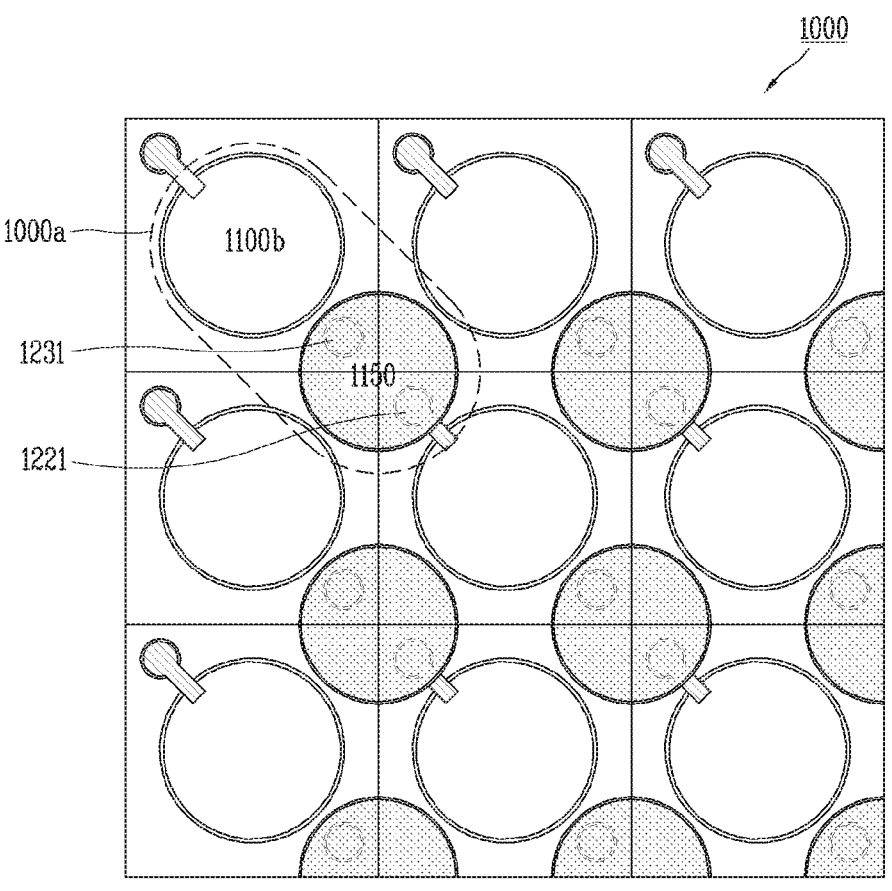

Meanwhile, FIGS. 19A and 19B illustrate a structure in which a third layer having chip-type third light emitting structures is stacked on the second layer having the second light emitting structures. FIG. 19A is a sectional and perspective view illustrating that the third layer of the third light emitting structures is stacked on the second layer of the second light emitting structures. FIG. 19B illustrates a structure in which the third light emitting structures of the third layer are connected to a wiring structure.

Referring to FIGS. 19A and 19B, the third light emitting structures 1150 can include red-light emitting elements. Each wiring structure 1200 of the red-light emitting elements 1150 can include a p-electrode 1231 and an n-common electrode 1221 formed on the bottom of the red-light emitting elements 1150. The first light emitting structure 1100a, the second light emitting structure 1120, and the third light emitting structure 1150 can form a unit pixel 1000a of green, blue, and red-light emitting elements. The unit pixels 1000a can be arranged in one axial direction and another axial direction to form the display device 1000.

Hereinafter, a structure in which the electrodes of the red-light emitting elements 1150 are connected to the first and second light emitting structures 1100a and 1100b will be described with reference to FIGS. 17A to 19B. In this regard, the n-common electrode 1221 of the red-light emitting elements 1150 can be connected to the n-common electrodes 1221a and 1221b of the first light emitting structures 1100a and the second light emitting structures 1100b.

The p-electrode 1231 of the red-light emitting elements 1150 can be aligned with the first p-electrode 1222b of the second light emitting structures 1100b. The p-electrode 1231 of the red-light emitting elements 1150 can be aligned with the first p-electrode 1222a of the first light emitting structures 1100a. In this regard, the p-electrode 1231 of the red-light emitting elements 1150 can be connected to the first p-electrode 1222b of the second light emitting structures 1100b in an aligned state. The p-electrode 1231 of the red-light emitting elements 1150 can be connected to the first p-electrode 1222a of the first light emitting structures 1100a in an aligned state.

So far, the display device having the light emitting structure according to the present disclosure has been described. Technical effects of a display device having a light emitting structure according to the present disclosure will be summarized as follows.

Also, technical effects of a manufacturing method for a display device having a light emitting structure according to the present disclosure can be summarized as follows.

According to the present disclosure, a red-light emitting element can be disposed on top of a stacked structure, to improve light utilization efficiency of the red-light emitting element.

According to the present disclosure, the red-light emitting element can be disposed on the top and implemented as a separate chip. Therefore, when the red-light emitting element made of a material which is different from a material of other light emitting elements is used, a facility contamination issue can be solved.

According to the present disclosure, the red-light emitting element can be disposed on the top and implemented as a separate chip. Therefore, when the red-light emitting element made of a material which is different from a material of other light emitting elements is used, an equipment operation efficiency degradation issue can be solved.

According to the present disclosure, a wiring structure disposed on an outer region of a light emitting structure can be used to facilitate arrangement of various electrodes and a connection wire as needed.

According to the present disclosure, since a metal electrode is not disposed in a light emitting body, a short-circuit issue between p-n regions when forming an ultra-fine electrode structure can be solved.

According to the present disclosure, as a metal is removed from the inside of the light emitting body, light efficiency can be improved by eliminating an influence of excitons due to a metal or absorption of internally formed photon energy into the metal.

According to the present disclosure, in the case of using a light emitting body such as an LED, damage due to internal etching that involves wiring formation inside the LED can be removed, which can contribute to efficiency improvement.

According to the present disclosure, when forming a stacked light emitting structure, polarization of light emitted from green, blue, and red-light emitting bodies can be controlled, which can be advantageous in alignment.

Further scope of applicability of the present disclosure will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

The aforementioned display device using the semiconductor light emitting element are not limited to the configuration and method of the embodiments described above, but the embodiments can be configured such that all or some of the embodiments are selectively combined so that various modifications can be made.

What is claimed is:

1. A display device having a light emitting structure, the display device comprising:
first light emitting structures stacked on a first insulating layer on top of a driving panel;
second light emitting structures stacked in alignment with the first light emitting structures on a second insulating layer on a top of the first light emitting structures; and
light emitting devices stacked on a third insulating layer on a top of the second light emitting structures to be spaced apart from centers of the second light emitting structures,
wherein the first light emitting structures, the second light emitting structures, and the light emitting devices constitute a first layer, a second layer and a third layer, respectively,
wherein the light emitting devices are configured as light emitting elements emitting red light and are disposed above the first and second light emitting structures in an offset structure,
wherein the light emitting devices are disposed between first and second light emitting elements, which are two second light emitting structures disposed in one axial direction,
wherein the light emitting devices include a p-electrode and an n-common electrode, wherein the p-electrode of the light emitting devices is connected to one of p-electrodes of the driving panel through an insulating structure in which the first to third insulating layers are vertically connected, and
wherein the n-common electrode formed in a lower region of the light emitting devices is connected at the top of the first light emitting structures and at the top of the second light emitting structures.

2. The display device of claim 1, wherein the light emitting elements are implemented as a flip-chip of a first diameter,
wherein the p-electrode connected to a lower region of the flip chip is connected to the one of the p-electrodes of the driving panel through the insulating structure spaced from the insulating layer surrounding the first light emitting element, and
wherein the n-common electrode is connected to the lower region of the flip chip is connected to the n-common electrode of the driving panel through a second insulating structure spaced from the insulating layer surrounding the second light emitting element.

3. The display device of claim 2, wherein the flip chip is disposed between third and fourth light emitting elements, which are two second light emitting structures disposed in another axial direction perpendicular to the one axis direction,
wherein one end of the flip chip in the another axial direction is disposed above the p-electrode of the third light emitting element,
wherein another end of the flip chip in the another axial direction is spaced apart from an insulating layer surrounding the fourth light emitting element, and
wherein the n-common electrode is connected to an n-electrode of the first light emitting structures and the n-electrode of the second light emitting structures.

4. The display device of claim 1, wherein the light emitting elements are implemented as a chip having a first diameter,
wherein the p-electrode connected to a lower region of the chip is connected to one of the p-electrodes of the driving panel through the insulating structure spaced from the insulating layer surrounding the first light emitting element.

5. The display device of claim 4, wherein the n-common electrode connected to an upper region of the chip is stacked on opposite side regions of the chip and an upper region of the third insulating layer formed in a region between the chips.

6. The display device of claim 5, wherein the n-electrode of the first light emitting structures and the n-electrode of the second light emitting structures are connected to a wiring structure penetrating a second insulating structure spaced from an insulating layer surrounding the second light emitting element to form the n-common electrode, and
wherein the n-common electrode of the first light emitting structures and the second light emitting structures is formed in a structure separated from the n-common electrode connected to the upper region of the chip.

7. The display device of claim 5, wherein the light emitting element is implemented with a second chip having a second diameter smaller than the first diameter,
wherein the second chip disposed on the third layer is disposed between first and second light emitting elements, which are two second light emitting structures disposed in the one axial direction, and
wherein the p-electrode connected to a metal layer extending from a lower part of the second chip in a lateral direction is connected to one of the p-electrodes of the driving panel through the insulating structure spaced from the insulating layer surrounding the first light emitting element.

8. The display device of claim 7, wherein the n-common electrode connected to an upper region of the second chip is stacked on one side region of the second chip and an upper region of the third insulating layer formed in a region between the chips.

9. The display device of claim 8, wherein the n-electrode of the first light emitting structures and the n-electrode of the second light emitting structures are connected to a wiring structure penetrating a second insulating structure spaced from the insulating layer surrounding the second light emitting element to form the n-common electrode, and wherein the n-common electrode of the first light emitting structures and the second light emitting structures is formed in a structure separated from the n-common electrode connected to the upper region of the second chip.

10. The display device of claim 7, wherein the n-common electrode connected to an upper region of the second chip is stacked on the upper region of the second chip and an upper region of a fourth insulating layer disposed on the third insulating layer, wherein the n-electrode of the first light emitting structures and the n-electrode of the second light emitting structures are connected to a wiring structure penetrating a second insulating structure spaced from the insulating layer surrounding the second light emitting element to form the n-common electrode, and wherein the n-common electrode of the first light emitting structures and the second light emitting structures is formed in a structure separated from the n-common electrode formed in the upper region of the second chip.

11. The display device of claim 1, wherein the driving panel includes an n-common electrode, a p-red electrode, a p-green electrode, and a p-blue electrode, wherein insulating layers formed to surround front and side surfaces of the first light emitting structures and the second light emitting structures form a via structure to connect electrodes of the first layer to the third layer and the electrodes of the driving panel, wherein the display device further comprises a wiring structure formed on front and side surfaces of the insulating layers on the front and side surfaces to connect the first light emitting structures and the second light emitting structures to the electrodes of the driving panel, and wherein the wiring structure of the first layer includes first and second wiring structures disposed in one axial direction and a third wiring structure disposed in another axial direction of the first light emitting structures.

12. The display device of claim 11, wherein boundary regions of the insulating layers disposed on a front surface include extension regions extending from a circular shape to a rectangular shape, and the insulating layers form a via structure of an inclined side to have a narrower diameter in a downward direction, and wherein electrodes of the first layer to the third layer are connected to the electrodes of the driving panel through the extension regions of the insulating layer.

13. The display device of claim 1, further comprising:

wiring structures disposed on side surfaces of the first light emitting structures and the second light emitting structures;

a light reflection layer disposed under the first light emitting structures; and a wavelength selective reflection layer disposed between the first light emitting structures and/or the second light emitting structures or disposed on top of the second light emitting structures, wherein a third light emitting structure disposed on the wiring structures, and wherein the third light emitting structure is formed of the light emitting elements spaced apart from the first light emitting structures and the second light emitting structures.

14. The display device of claim 13, further comprising a light reflection structure formed of a metal material on a side region of the third light emitting structure, wherein the light reflection structure extends down to a lower region of the third light emitting structure or a second light reflection layer is disposed between the third light emitting structure and the wiring structures.

15. The display device of claim 14, further comprising a second light reflection structure formed of a metal material on side regions of the first light emitting structures and the second light emitting structures, wherein the second light reflection layer is disposed between the third light emitting structure and the wiring structures.

16. The display device of claim 13, further comprising a light scattering structure disposed on the top of the second light emitting structures and/or on a top of the third light emitting structure.

17. The display device of claim 2, wherein, when the first light emitting structures are configured as green-light emitting elements;

each wiring structure of the first light emitting structures includes an n-common electrode spaced apart from the first insulating layer, and a first p-electrode, a second p-electrode, and a third p-electrode of red, blue, and green;

the third p-electrode is connected at a bottom of the first light emitting structures, wherein, when the second light emitting structures are configured as blue-light emitting elements:

each wiring structure of the second light emitting structures includes an n-common electrode spaced apart from the second insulating layer, and a first p-electrode and a second p-electrode of red and blue;

the second p-electrode is connected at the bottom of the first light emitting structures, wherein, when the light emitting elements are configured as red-light emitting elements:

each wiring structure of the red-light emitting elements includes a p-electrode and an n-common electrode formed on bottom of the red-light emitting elements, and wherein, when the n-common electrode of the red-light emitting elements is connected to the n-common electrode of the first light emitting structures and the second light emitting structures:

the p-electrode of the red-light emitting elements is connected to the first p-electrode of the first light emitting structures and the first p-electrode of the second light emitting structures.

18. A display device comprising:

first light emitting structures on a first insulating layer of a driving panel, and configured to emit one of blue light and green light;

second light emitting structures on a second insulating layer of the first light emitting structures, and configured to emit another of the blue light and the green light; and light emitting devices on a third insulating layer of the second light emitting structures and located offset from the second light emitting structures in a vertical direction in an offset structure, and the light emitting device configured to emit red light, wherein the light emitting devices are disposed between first and second light emitting elements, which are two second light emitting structures disposed in one axial direction, a p-wiring and an n-common wiring interposed between the light emitting devices and the driving panel, wherein the p-wiring and the n-common wiring extends directly from the light emitting devices to a p-electrode and an n-common electrode of the driving panel through first, second and third insulating layers, and wherein the n-common electrode formed in a lower region of the light emitting devices is connected at a top of the first light emitting structures and at a top of the second light emitting structures.

19. The display device of claim 18, wherein the first light emitting structures and the second light emitting structures include GaN, and the light emitting devices include AlGaInP, and wherein the third insulating layer between the light emitting devices and the second light emitting structure blocks contamination from AlGaInP.

20. The display device of claim 18, wherein first light emitting structures and the second light emitting structures are aligned in the vertical direction.

* * * * *